US010950650B2

(12) United States Patent
Ihara

(10) Patent No.: US 10,950,650 B2
(45) Date of Patent: Mar. 16, 2021

(54) COMPLEMENTARY METAL-OXIDE-SEMICONDUCTOR IMAGE SENSORS

(71) Applicant: SAMSUNG ELECTRONICS CO., LTD., Suwon-si (KR)

(72) Inventor: Hisanori Ihara, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/750,608

(22) Filed: Jan. 23, 2020

(65) Prior Publication Data

US 2020/0161363 A1    May 21, 2020

Related U.S. Application Data

(63) Continuation of application No. 16/213,016, filed on Dec. 7, 2018, now Pat. No. 10,615,216, which is a continuation of application No. 14/819,908, filed on Aug. 6, 2015, now Pat. No. 10,181,492.

(30) Foreign Application Priority Data

Aug. 11, 2014 (KR) .................. 10-2014-0103787

(51) Int. Cl.
*H01L 27/146* (2006.01)

(52) U.S. Cl.
CPC .... *H01L 27/14641* (2013.01); *H01L 27/1463* (2013.01); *H01L 27/1464* (2013.01); *H01L 27/14603* (2013.01); *H01L 27/14614* (2013.01); *H01L 27/14643* (2013.01); *H01L 27/14621* (2013.01); *H01L 27/14627* (2013.01)

(58) Field of Classification Search
CPC ......... H01L 27/14643; H01L 27/14603; H01L 27/14614; H01L 27/1463; H01L 27/1464; H01L 27/14641; H01L 27/14621; H01L 27/14627

See application file for complete search history.

(56) References Cited

U.S. PATENT DOCUMENTS

| | | | |
|---|---|---|---|
| 5,970,333 | A | 10/1999 | Gris et al. |
| 6,121,148 | A | 9/2000 | Bashir et al. |
| 7,525,077 | B2 | 4/2009 | Kim et al. |
| 7,964,929 | B2 | 6/2011 | Fan |
| 7,968,922 | B2 | 6/2011 | Ichikawa |

(Continued)

FOREIGN PATENT DOCUMENTS

| | | |
|---|---|---|
| JP | 2970637 | 8/1999 |
| JP | 2013-089936 | 5/2013 |

(Continued)

*Primary Examiner* — Feifei Yeung Lopez
(74) *Attorney, Agent, or Firm* — Sughrue Mion, PLLC

(57) ABSTRACT

A CMOS image sensor includes a substrate and at least one device isolation region in the substrate and defining first and second pixel regions and first and second active portions in each of the first and second pixel regions. A reset and select transistor gates are disposed in the first pixel region, while a source follower transistor gate is disposed in the second pixel region, such that pixels in the first and second pixel regions share the reset, select and source follower transistors. A length of the source follower transistor gate may be greater than lengths of the reset and selection transistor gates.

20 Claims, 21 Drawing Sheets

(56) References Cited

U.S. PATENT DOCUMENTS

| | | | |
|---|---|---|---|
| 8,106,984 B2 | 1/2012 | Takeuchi et al. | |
| 8,217,437 B2 | 7/2012 | Hynecek | |
| 8,242,546 B2 | 8/2012 | Hynecek | |
| 8,691,660 B2 | 4/2014 | Schuler et al. | |
| 8,716,769 B2 | 5/2014 | Ihara et al. | |
| 8,637,910 B2 | 7/2014 | Koo et al. | |
| 8,823,070 B2 | 9/2014 | Hisanori | |
| 2005/0110884 A1* | 5/2005 | Altice, Jr. | H01L 27/14641 348/302 |
| 2005/0237405 A1* | 10/2005 | Ohkawa | H01L 27/14609 348/308 |
| 2007/0158713 A1* | 7/2007 | Ohkawa | H01L 27/14689 257/292 |
| 2010/0231761 A1 | 9/2010 | Yanai | |
| 2011/0180859 A1 | 7/2011 | Tatani | |
| 2013/0140442 A1 | 6/2013 | Yanagita et al. | |
| 2014/0015025 A1 | 1/2014 | Ahn et al. | |
| 2014/0175592 A1 | 6/2014 | Iwabuchi et al. | |
| 2015/0340391 A1* | 11/2015 | Webster | H01L 27/14621 348/322 |
| 2016/0020237 A1 | 1/2016 | Yamakawa | |
| 2017/0237916 A1 | 8/2017 | Sakano et al. | |

FOREIGN PATENT DOCUMENTS

| | | |
|---|---|---|
| JP | 2013118273 A | 6/2013 |
| KR | 10-0670606 | 1/2007 |
| KR | 10-2011-0065175 | 6/2011 |
| KR | 1020140009802 A | 1/2014 |

* cited by examiner

2000

COMPLEMENTARY METAL-OXIDE-SEMICONDUCTOR IMAGE SENSORS

CROSS-REFERENCE TO RELATED APPLICATIONS

This is a continuation of U.S. application Ser. No. 16/213,016 filed Dec. 7, 2018, which is a continuation application of U.S. application Ser. No. 14/819,908, filed Aug. 6, 2015, which claims priority under 35 U.S.C. § 119 to Korean Patent Application No. 10-2014-0103787, filed Aug. 11, 2014, the disclosure of which is hereby incorporated herein by reference in their entireties.

BACKGROUND

The inventive concepts relate to image sensors. More particularly, the inventive concepts relate to image sensors capable of improving charge transfer efficiency.

Image sensors may convert an optical image into an electrical signal. As computer and communication industries have developed, demand for high performance image sensors has increased for various applications, such as digital cameras, camcorders, personal communication systems (PCS), gaming devices, security cameras, and medical micro-cameras.

Image sensors may include charge coupled devices (CCDs) and complementary metal-oxide-semiconductor (CMOS) image sensors. Driving CMOS image sensors may be relatively simple and CMOS image sensors may include image sensing elements and a signal processing circuit that are integrated on a single chip. Thus, CMOS image sensors can be reduced in size relatively easily. In addition, CMOS image sensors may have low power consumption, so they may be well-suited for devices having limited battery capacity. CMOS image sensors may also be manufactured using a CMOS process technique to reduce their manufacturing costs. For at least these reasons, CMOS image sensors have been increasingly used in various fields.

SUMMARY

Embodiments of the inventive concepts may provide image sensors capable of reducing noise.

Some embodiments provide a complementary metal-oxide-semiconductor (CMOS) image sensor including a substrate and at least one device isolation region in the substrate and defining first and second pixel regions and first and second active portions in each of the first and second pixel regions. First and second photoelectric regions are disposed in respective ones of the first and second pixel regions and coupled to respective ones of the first active portions of the first and second pixel regions. One or more floating diffusion nodes are disposed in the substrate, and first and second transfer gates are disposed on respective ones of the first and second active portions of the first and second pixel regions and configured to control coupling of respective ones of the first and second photoelectric regions to the one or more floating diffusion nodes. The image sensor also includes a reset transistor electrically connected to each of the one or more floating diffusion nodes and having a reset gate disposed on the second active portion of the first pixel region and a source follower transistor having a source follower gate electrically connected to each of the one or more floating diffusion nodes and disposed on the second active portion of the second pixel region. The image sensor further includes a selection transistor electrically connected to the source follower transistor and having a selection gate disposed on the second active portion of the first pixel region. A length of the source follower gate may be greater than lengths of the reset gate and the selection gate.

In some embodiments, the first active portions of the first and second pixel regions may be disposed between the second active portions of the first and second pixel regions.

In some embodiments, the first and second photoelectric regions may include first and second photoelectric conversion layers having a first conductivity type in respective ones of the first and second pixel regions and the CMOS image sensor further may include respective well dopant layers having a second conductivity type disposed on the first and second photoelectric conversion layers. The at least one device isolation region may include respective device isolation regions disposed in the well dopant layers. The first active portions and the second active portions may overlap the first and second photoelectric conversion layers.

In some embodiments, the one or more floating diffusion nodes may include first and second floating diffusion regions in respective ones of the first active portions of the first and second pixel regions, and the CMOS image sensor may further include a first interconnection conductor electrically connecting the first and second floating diffusion regions to the source follower gate.

In some embodiments, the image sensor may further include a first dopant region disposed in the second active portion beside the selection gate in the first pixel region, a second dopant region disposed in the second active portion beside the source follower gate in the second pixel region, and a second interconnection conductor electrically connecting the first and second dopant regions. The second dopant region may be disposed at a first side of the source follower gate and the CMOS image sensor may further include a third dopant region disposed in the second active portion at a second side of the source follower gate in the second pixel region and a third interconnection conductor electrically connected to the third dopant region. The image sensor may further include first contact plugs electrically connecting the first dopant region to the second interconnection conductor and second contact plugs electrically connecting the second dopant region to the second interconnection conductor. The number of the first contact plugs may be different from the number of the second contact plugs.

In further embodiments, the image sensor may include a common active portion in the substrate and connecting the first active portion of the first pixel region to the first active portion of the second pixel region. The one or more floating diffusion nodes may include a common floating diffusion region in the common active portion and the first and second transfer gates may be disposed on respective ones of the first active portions of the first and second pixel regions on first and second sides of the common floating diffusion region.

Further embodiments of the inventive concepts provide a CMOS image sensor including a substrate having first and second surfaces on opposite sides thereof, a photoelectric conversion layer in the substrate and having a first conductivity type, and a device isolation layer disposed in the substrate proximate the first surface of the substrate and defining a first active portion and a second active portion. The image sensor further includes a first transistor gate on the first active portion and a second transistor gate on the second active portion. The first and second active portions have the substantially same width and the substantially same length, and a length of the first transistor gate is greater than a length of the second transistor gate.

In some embodiments, the image sensor further includes a transfer gate on the photoelectric conversion layer, a floating diffusion region in the substrate beside the transfer gate, and a first interconnection conductor electrically connecting the floating diffusion region to the first transistor gate. In further embodiments, the image sensor further includes a deep device isolation layer penetrating the substrate and surrounding the photoelectric conversion layer.

In some embodiments, the substrate further includes a well dopant layer disposed on the photoelectric conversion layer and having a second conductivity type. The device isolation layer may be in the well dopant layer.

In some embodiments, the transfer gate overlaps with the photoelectric conversion layer when viewed from a plan view.

The CMOS image sensor may further include a first dopant region and a second dopant region in the first active portion on respective first and second sides of the first transistor gate, a third dopant region and a fourth dopant region in the second active portion on respective first and second sides of the second transistor gate, and a second interconnection conductor electrically connecting the first and third dopant regions to each other. The image sensor may further include a plurality of first contact plugs electrically connecting the first dopant region to the second interconnection conductor and a plurality of second contact plugs electrically connecting the third dopant region to the second interconnection conductor.

In some embodiments, the image sensor may further include a third transistor gate disposed on the second active portion, wherein a length of the third transistor gate is smaller than the length of the first transistor gate.

Still further embodiments provide a CMOS image sensor including a first device isolation layer disposed in a substrate and defining a first pixel region and a second pixel region, a second device isolation layer defining a first active portion and a second active portion in each of the first and second pixel regions, a reset gate and a selection gate disposed on the second active portion of the first pixel region, and a source follower gate disposed on the second active portion of the second pixel region.

Additional embodiments provide a CMOS image sensor including a substrate, a photoelectric conversion layer in the substrate and having a first conductivity type, a well dopant layer in the substrate and proximate a first surface of the substrate, the well dopant layer having a second conductivity type, a device isolation layer in the well dopant layer defining a first active portion and a second active portion, a first transistor gate on the first active portion, and a second transistor gate on the second active portion.

BRIEF DESCRIPTION OF THE DRAWINGS

The inventive concepts will become more apparent in view of the attached drawings and accompanying detailed description.

DETAILED DESCRIPTION

Figure 1:
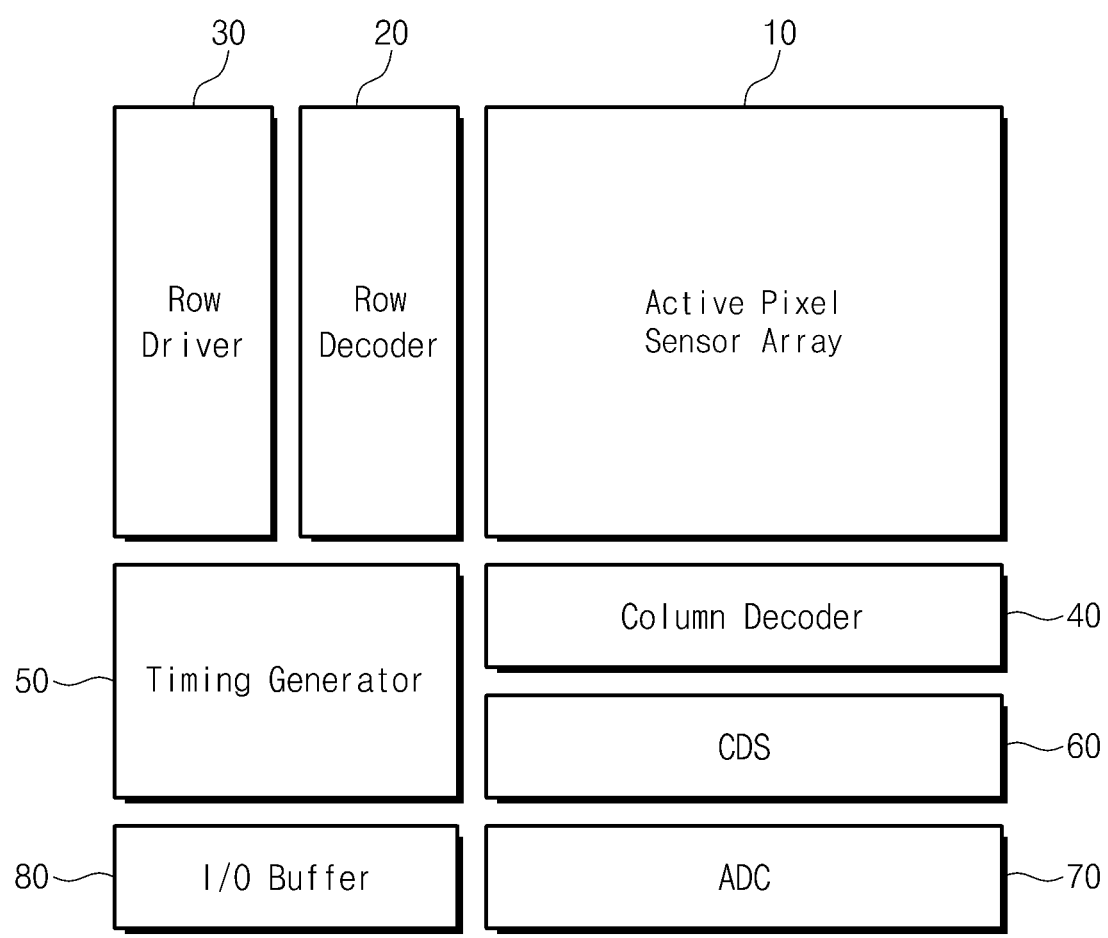
FIG. 1 is a schematic block diagram illustrating a CMOS image sensor according to example embodiments of the inventive concepts.

The inventive concepts will now be described more fully hereinafter with reference to the accompanying drawings, in which some example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the example embodiments in the detailed description will be described with sectional views as ideal example views of the inventive concepts. Accordingly, shapes of the example views may be modified according to manufacturing techniques and/or allowable errors. Therefore, embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limiting to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Example embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Devices and methods of forming such devices according to various embodiments described herein may be embodied in microelectronic devices such as integrated circuits, wherein a plurality of devices according to various embodiments described herein may be integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a schematic block diagram illustrating a CMOS image sensor according to example embodiments of the inventive concepts.

Referring to FIG. 1, a CMOS image sensor may include an active pixel sensor array 10, a row decoder 20, a row driver 30, a column decoder 40, a timing generator 50, a correlated double sampler (CDS) 60, an analog-to-digital converter (ADC) 70, and an input/output (I/O) buffer 80.

The active pixel sensor array 10 may include a plurality of unit pixels two-dimensionally arranged and may convert optical signals into electrical signals. The active pixel sensor array 10 may be driven by a plurality of driving signals provided from the row driver 30. For example, the driving signals may include a pixel selection signal, a reset signal, and a charge transfer signal. The converted electrical signals may be provided to the correlated double sampler 60.

The row driver 30 may provide the driving signals for driving a plurality of unit pixels to the active pixel sensor array 10 in response to results decoded in the row decoder 20. When the unit pixels are arranged in a matrix having rows and columns, the driving signals corresponding to each row may be provided at once.

The timing generator 50 may provide a timing signal and a control signal to the row decoder 20 and the column decoder 40.

The correlated double sampler 60 may receive the electrical signals generated in the active pixel sensor array 10 to hold and sample the received electrical signals. The correlated double sampler 60 may doubly sample a specific noise level and a signal level of the electrical signal and may then output a difference level between the noise level and the signal level.

The analog-to-digital converter 70 may convert an analog signal corresponding to the difference level output from the correlated double sampler 60 into a digital signal. In addition, the analog-to-digital convertor 70 may output the digital signal.

The I/O buffer 80 may latch the digital signals, and the latched digital signals may be sequentially output as digital signals to an image signal processing part (not shown) in response to results decoded in the column decoder 40.

Figure 2:
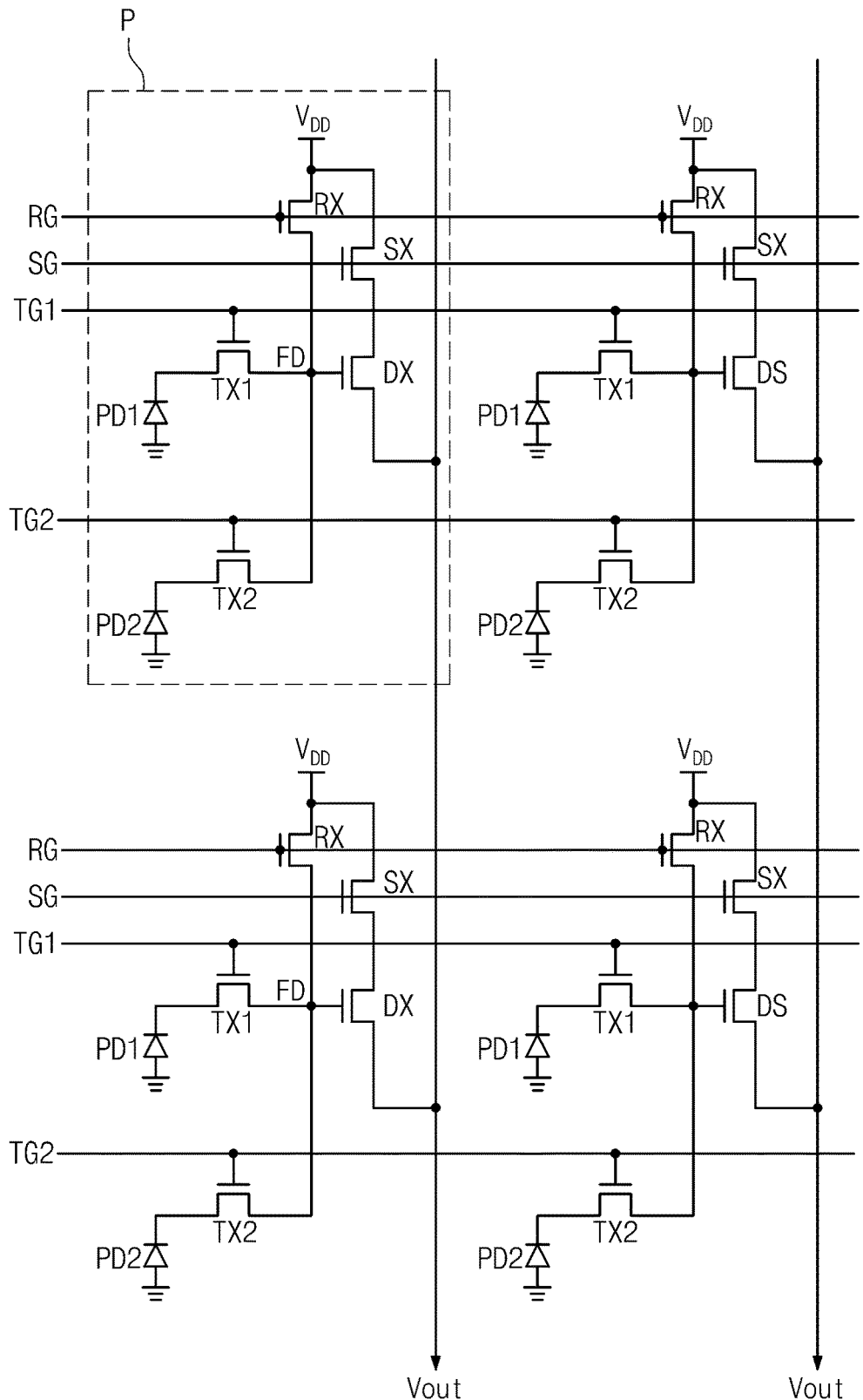
FIG. 2 is a circuit diagram illustrating an active pixel sensor array of a CMOS image sensor according to example embodiments of the inventive concepts.

FIG. 2 is a circuit diagram illustrating an active pixel sensor array of a CMOS image sensor according to example embodiments of the inventive concepts.

Referring to FIG. 2, the active pixel sensor array 10 may include a plurality of unit pixels P arranged in a matrix. In some embodiments, each of the unit pixels P may include first and second transfer transistors TX1 and TX2 and logic transistors RX, SX, and DX. The logic transistors may include a reset transistor RX, a selection transistor SX, and a drive transistor (or a source follower transistor) DX.

The first transfer transistor TX1 may include a first transfer gate TG1 and a first photoelectric conversion element PD1, and the second transfer transistor TX2 may include a second transfer gate TG2 and a second photoelectric conversion element PD2. The first and second transfer transistors TX1 and TX2 share a charge detection node (i.e., a floating diffusion region) FD.

The first and second photoelectric conversion elements PD1 and PD2 may generate photo-charges in proportion to the intensity of external light incident thereon and may accumulate the generated photo-charges. Each of the first and second photoelectric conversion elements PD1 and PD2 may use a photo diode, a photo transistor, a photo gate, a pinned photo diode (PPD), or any combination thereof.

The first and second transfer gates TG1 and TG2 may transfer the charges accumulated in the first and second photoelectric conversion elements PD1 and PD2 to the charge detection node (i.e., the floating diffusion region) FD. Complementary signals may be applied to the first and second transfer gates TG1 and TG2 to selectively transfer charge from the first and second photoelectric conversion elements PD1 and PD2 to the charge detection node FD.

The charge detection node FD may cumulatively store the charges received from the first and second photoelectric conversion elements PD1 and PD2. The drive transistor DX may be controlled according to the amount of the photo-charges accumulated in the charge detection node FD.

The reset transistor RX may periodically reset the charge detection node FD. A source electrode of the reset transistor RX may be connected to the charge detection node FD, and a drain electrode of the reset transistor RX may be connected to a power voltage VDD. If the reset transistor RX is turned-on, the power voltage VDD connected to the drain electrode of the reset transistor RX may be coupled to the charge detection node FD. Thus, charge accumulated in the charge detection node FD may be discharged when the reset transistor RX is turned-on, thus resetting the charge detection node FD.

The drive transistor DX may be combined with a constant current source (not shown) located outside the unit pixel P to act as a source follower buffer amplifier. The drive transistor DX may amplify a potential variation of the charge detection node FD and may then output the amplified potential variation to an output line Vout.

The selection transistor SX may select a unit cell to be sensed. In some embodiments, signals of all the pixels of one row may be sensed at the same time. When the selection transistor SX is turned-on, the power voltage VDD may be transmitted to a drain electrode of the drive transistor DX.

Figure 3:
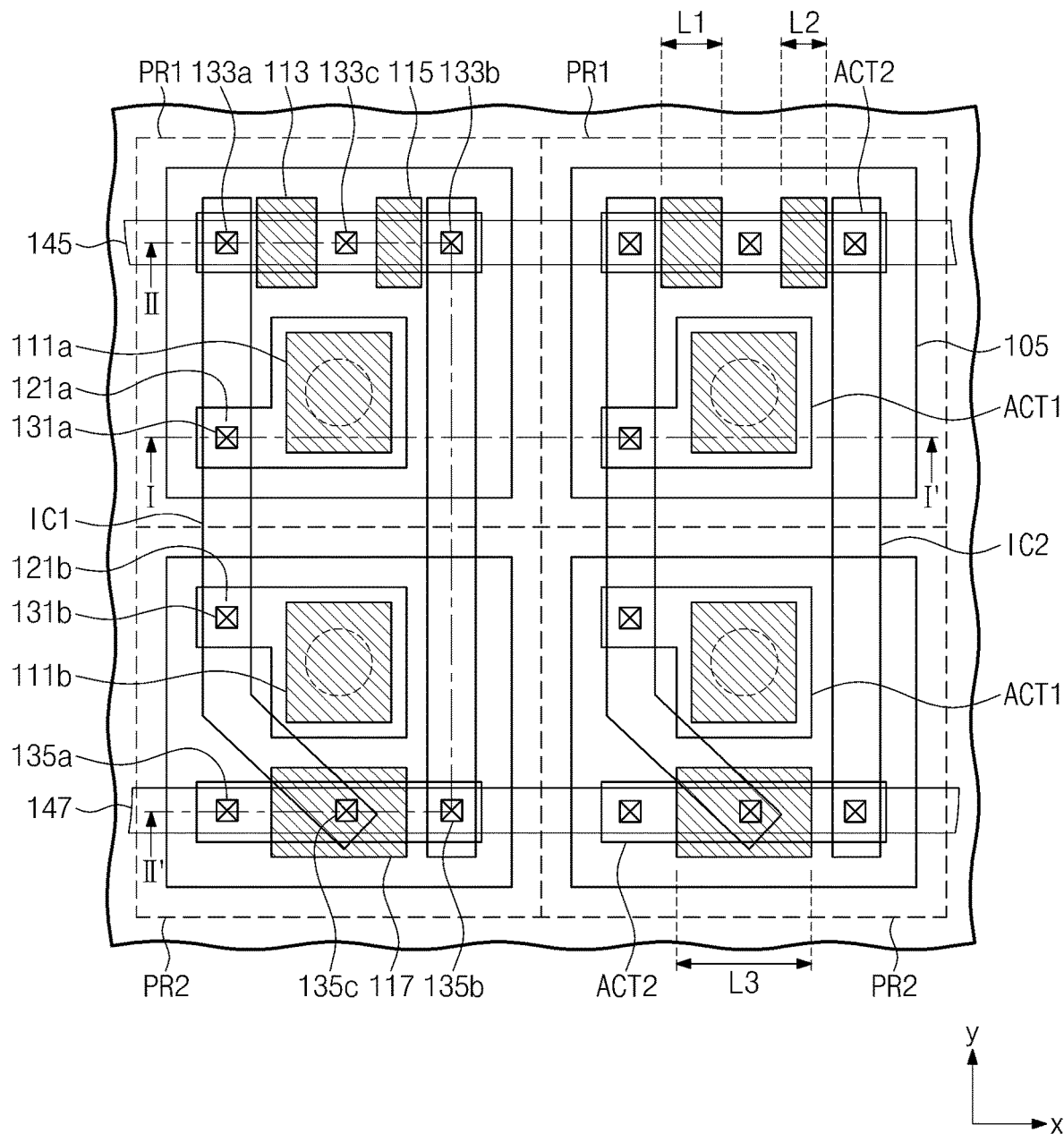
FIG. 3 is a schematic plan view illustrating a CMOS image sensor according to first embodiments of the inventive concepts.
Figure 4:
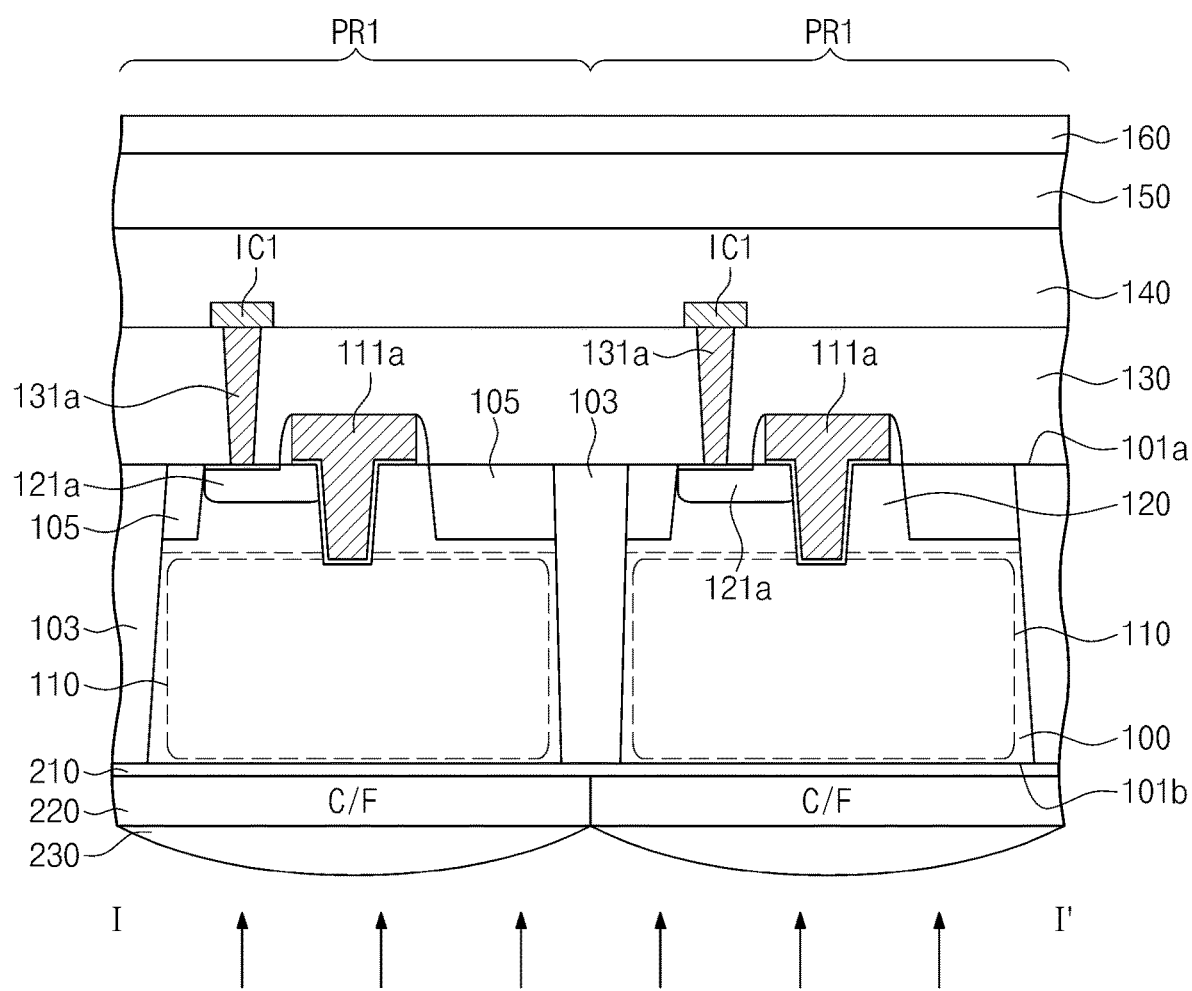
FIG. 4 is a cross-sectional view taken along a line I-I' of FIG. 3.

FIG. 3 is a schematic plan view illustrating a CMOS image sensor according to first embodiments of the inventive concepts. FIG. 4 is a cross-sectional view taken along a line I-I' of FIG. 3, and FIG. 5 is a cross-sectional view taken along a line II-II' of FIG. 3.

Figure 5:
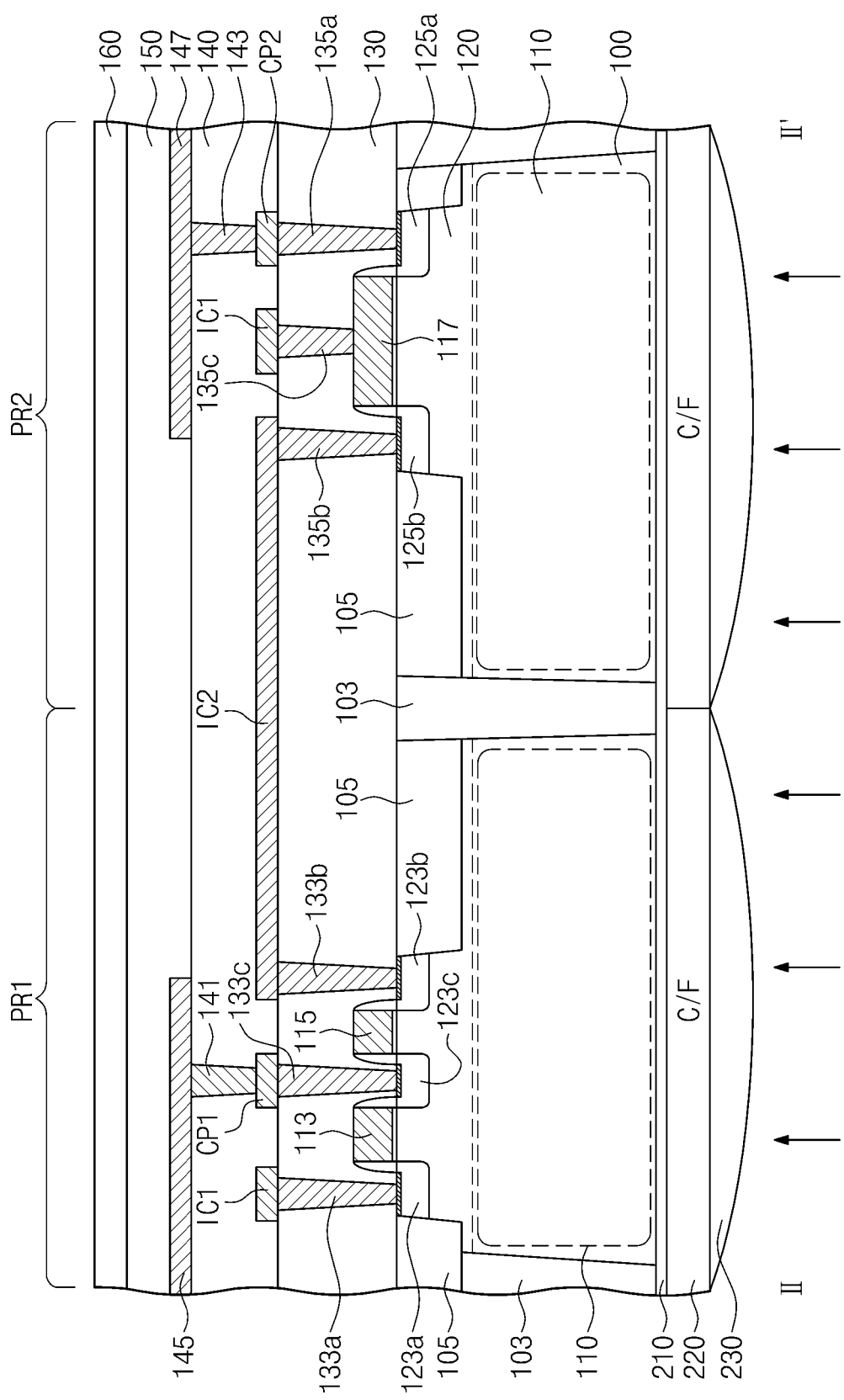
FIG. 5 is a cross-sectional view taken along a line II-II' of FIG. 3.

Referring to FIGS. 3, 4, and 5, a substrate 100 may include a first pixel region PR1 and a second pixel region PR2. Each of the first and second pixel regions PR1 and PR2 may include a first active portion ACT1 and a second active portion ACT2. In some embodiments, the first pixel region PR1 may one of a plurality of such regions, and the plurality of first pixel regions PR1 may be distributed along an x-axis direction. Likewise, the second pixel region PR2 may be one of a plurality of such regions, and the plurality of second pixel regions PR2 may be distributed along the x-axis direction. The first and second pixel regions PR1 and PR2 may be alternately arranged along a y-axis direction.

In some embodiments, the first active portions ACT1 of the first and second pixel regions PR1 and PR2 may be laterally adjacent one another. In other words, the first active portions ACT1 of the first and second pixel regions PR1 and PR2 may be disposed between the second active portions ACT2 of the first and second pixel regions PR1 and PR2 when viewed from a plan view.

In more detail, the substrate 100 may have a first surface (or a front surface) 101a and a second surface (or a back surface) 101b on opposite sides of the substrate 100. The substrate 100 may be, for example, a bulk silicon substrate, a silicon-on-insulator (SOI) substrate, or a semiconductor epitaxial layer.

In some embodiments, an interconnection structure may be disposed on the first surface 101a of the substrate 100. The interconnection structure may include logic transistors and interconnections IC1, IC2, W1, and W2 connected to the logic transistors. A color filter array including color filters 220 and a micro-lens array including micro-lenses 230 may be disposed on the second surface 101b of the substrate 100. In addition, a planarization layer 210 may be disposed between the second surface 101b of the substrate 100 and the color filter array. In more detail, each of the color filters 220 and each of the micro-lenses 230 may correspond to each of the first and second pixel regions PR1 and PR2. The color filter 220 may include a red, or green, or blue color filter according to a corresponding unit pixel. The micro-lens 230 may have a convex shape and may have a predetermined radius of curvature. The micro-lens 230 may condense light incident on each of the first and second pixel regions PR1 and PR2.

A photoelectric conversion layer 110 and a well dopant layer 120 may be formed in the substrate 100 of each of the first and second pixel regions PR1 and PR2. The photoelectric conversion layer 110 generates photo-charges in proportion to the intensity of the incident light. The photoelectric conversion layer 110 may be formed by ion-implanting dopants into the substrate 100. A conductivity type of the dopants of the photoelectric conversion layer 110 may be opposite to that of the substrate 100. A dopant concentration of a portion, adjacent to the first surface 101a, of the photoelectric conversion layer 110 may be different from that of another portion, adjacent to the second surface 101a, of the photoelectric conversion layer 110, such that the photoelectric conversion layer 110 may have a potential gradient between the first surface 101a and the second surface 101b. For example, the photoelectric conversion layer 110 may include a plurality of stacked dopant regions of which dopant concentrations are different from each other. The well dopant layer 120 may be disposed on the photoelectric conversion layer 110 and may be adjacent to the first surface 101a of the substrate 100. The well dopant layer 120 may be doped with dopants of which a conductivity type is opposite to that of the photoelectric conversion layer 110. In some embodiments, the photoelectric conversion layer 110 may be doped with N-type dopants, and the well dopant layer 120 may be doped with P-type dopants.

A first device isolation layer 103 may vertically extend from the first surface 101a to the second surface 101b in the substrate 100 and defining the first and second pixel regions PR1 and PR2 of the substrate 100. The first device isolation layer 103 may surround the photoelectric conversion layer 110.

The first device isolation layer 103 may include an insulating material of which a refractive index is lower than that of the substrate100 (e.g., a silicon substrate). For example, the first device isolation layer 103 may include a silicon oxide layer, a silicon nitride layer, an undoped poly-silicon layer, air, or any combination thereof. In some embodiments, the first surface 101a and/or the second surface 101b of the substrate 100 may be patterned to form a deep trench, and the first device isolation layer 103 may be formed by filling the deep trench with an insulating material. The first device isolation layer 103 may refract light obliquely incident on the photoelectric conversion layer 110. The first device isolation layer 103 may prevent the photo-charges generated by the incident light from moving to neighboring first and second pixel regions PR1 and PR2 by random drift.

A second device isolation layer 105 may define the first and second active portions ACT1 and ACT2. The first and second active portions ACT1 and ACT2 may be spaced apart from each other in each of the first and second pixel regions PR1 and PR2. The first and second active portions ACT1 and ACT2 may have different sizes. In some embodiments, the second device isolation layer 105 may be formed in the well dopant layer 120. A vertical depth of the second device isolation layer 105 from the first surface 101a of the substrate 100 may be smaller than a vertical depth of the first device isolation layer 103. A bottom surface of the second device isolation layer 105 may be located within the well dopant layer 120 and may be spaced apart from the photoelectric conversion layer 110. In some embodiments, the first surface 101a of the substrate 100 may be patterned to form a shallow trench, and the second device isolation layer 105 may be formed by filling the shallow trench with an insulating material. In some embodiments, the second device isolation layer 105 may be a dopant region that has the same conductivity type as the well dopant layer 120. In this case, a dopant concentration of the second device isolation layer 105 may be greater than that of the well dopant layer 120.

According to some embodiments of the inventive concepts, a first transfer gate 111a and a first floating diffusion region 121a may be disposed at the first active portion ACT1 of the first pixel region PR1, and a second transfer gate 111b and a second floating diffusion region 121b may be disposed at the first active portion ACT1 of the second pixel region PR2.

In some embodiments, when viewed from a plan view, the first and second transfer gates 111a and 111b may be disposed in central portions of the first and second pixel regions PR1 and PR2, respectively. Each of the first and second transfer gates 111a and 111b may include a lower portion inserted into the well dopant region 120, and an upper portion connected to the lower portion and protruding from the first surface 101a of the substrate 100. In some embodiments, the lower portions of the first and second transfer gates 111a and 111b may penetrate portions of the well dopant regions 120, respectively. A gate insulating layer may be disposed between the substrate 100 and the transfer gates 111a and 111b. In some embodiments, trenches may be formed in the well dopant layer 120 exposed at the first active portions ACT1, and a gate insulating layer and a gate conductive layer may be sequentially formed on the substrate 100 to fill the trenches. The gate conductive layer may be patterned to form the first and second transfer gates 111a and 111b.

The first floating diffusion region 121a may be formed in the well dopant layer 120 at a side of the first transfer gate 111a, and the second floating diffusion region 121b may be formed in the well dopant layer 120 at a side of the second transfer gate 111b. The first and second floating diffusion regions 121a and 121b may be formed, for example, by an ion implantation process, and a conductivity type of the first and second floating diffusion regions 121a and 121b may be opposite to that of the well dopant layer 120. For example, the first and second floating diffusion regions 121a and 121b may be doped with N-type dopants.

According to some embodiments of the inventive concepts, a reset gate 113 and a selection gate 115 may be disposed at the second active portion ACT2 of the first pixel region PR1, and a source follower gate 117 may be disposed at the second active portion ACT2 of the second pixel region PR2. The reset gate 113, and the selection gate 115, and the source follower gate 117 may be disposed on the well dopant layer 120. The gate insulating layer may also be disposed between the well dopant layer 120 and the gates 113, 115, and 117.

In some embodiments, the reset gate 113 may have a first length L1, the selection gate 115 may have a second length L2, and the source follower gate 117 may have a third length L3. The first length L1 may be greater than the second length L2, and the third length L3 may be greater than the first and second lengths L1 and L2. In other words, the length L3 of the source follower gate 117 may be greater than the lengths L1 and L2 of the reset and selection gates 113 and 115. In some embodiments, the second active portions ACT2 of the first and second pixel regions PR1 and PR2 may have the substantially same width and the substantially same length.

Charges may be randomly trapped or de-trapped to or from the gate insulating layer by current fluctuation occurring in a channel of the source follower transistor (DX of FIGS. 2A and 2B). However, some embodiments provide a source follower gate 117 with increased size, noise that may be caused by the randomly trapped or de-trapped charges may be reduced.

A first dopant region 123a may be formed in the well dopant layer 120 at a side of the reset gate 113, and a second dopant region 123b may be formed in the well dopant layer 120 at a side of the selection gate 115. A common dopant region 123c may be formed in the well dopant layer 120 between the reset gate 113 and the selection gate 115. When viewed from a plan view, the reset gate 113, the common dopant region 123c, and the selection gate 115 may be disposed between the first dopant region 123a and the second dopant region 123b. A third dopant region 125a may be formed in the well dopant layer 120 at a side of the source follower gate 117, and a fourth dopant region 125b may be formed in the well dopant layer 120 at another side of the source follower gate 117. In some embodiments, the first to fourth dopant regions 123a, 123b, 125a, and 125b and the common dopant region 123c may be formed by ion-implanting dopants of which a conductivity type is opposite to that of the dopants of the well dopant layer 120. For example, the first to fourth dopant regions 123a, 123b, 125a, and 125b and the common dopant region 123c may be doped with N-type dopants.

A first interlayer insulating layer 130 may be disposed on the first surface 101a of the substrate 100. The first interlayer insulating layer 130 may cover the first and second transfer gates 111a and 111b, the reset gate 113, the selection gate 115, and the source follower gate 117.

A plurality of contact plugs may be disposed in the first interlayer insulating layer 130. In some embodiments, a first contact plug 133a may be connected to the first dopant region 123a, and a second contact plug 133b may be connected to the second dopant region 123b. A common contact plug 133c may be connected to the common dopant region 123c. A third contact plug 135a may be connected to the third dopant region 125a, and a fourth contact plug 135b may be connected to the fourth dopant region 125b. A gate contact plug 135c may be connected to the source follower gate 117. In addition, first and second FD contact plugs 131a and 131b may be connected to the first and second floating diffusion regions 121a and 121b, respectively.

In some embodiments, each of the contact plugs may include a barrier metal layer and a metal layer. For example, the barrier metal layer may be formed of a metal nitride layer such as a titanium nitride layer, a tantalum nitride layer, a tungsten nitride layer, a hafnium nitride layer, and/or a zirconium nitride layer. For example, the metal layer may include at least one of tungsten, copper, hafnium, zirconium, titanium, tantalum, aluminum, ruthenium, palladium, platinum, cobalt, nickel, or conductive metal nitrides. In some embodiments, a silicide layer may be formed between each of the contact plugs and the each of the dopant regions.

In some embodiments, the first and second floating diffusion regions 121a and 121b, the first dopant region 123a, and the source follower gate 117 may be electrically connected to each other through a first interconnection conductor IC1. In some embodiments, the first interconnection conductor IC1 may extend substantially along the y-axis direction. The first interconnection conductor IC1 may be disposed on the first interlayer insulating layer 130 so as to be electrically connected to the first and second floating diffusion regions 121a and 121b through the first and second FD contact plugs 131a and 131b. In addition, the first interconnection conductor IC1 may be electrically connected to the first dopant region 123a through the first contact plug 133a and may be electrically connected to the source follower gate 117 through the gate contact plug 135c.

In some embodiments, the second dopant region 123b and the fourth dopant region 125b may be electrically connected to each other through a second interconnection conductor IC2. In some embodiments, the second interconnection conductor IC2 may substantially extend in the y-axis direction. The second interconnection conductor IC2 may be electrically connected to the second dopant region 123b through the second contact plug 133b and may be electrically connected to the fourth dopant region 125b through the fourth contact plug 135b. In other words, the selection transistor (SX of FIG. 2) of the first pixel region PR1 may be connected in series to the source follower transistor (DX of FIG. 2) of the second pixel region PR2 through the second interconnection conductor IC2. A first conductive pattern CP1 and a second conductive pattern CP2 may be disposed on the first interlayer insulating layer 130 so as to be connected to the common contact plug 133c and the third contact plug 135a, respectively.

In some embodiments, the first and second interconnection conductors IC1 and IC2 and the first and second conductive patterns CP1 and CP2 may include at least one of copper (Cu), aluminum (Al), tungsten (W), titanium (Ti), molybdenum (Mo), tantalum (Ta), titanium nitride (TiN), tantalum nitride (TaN), zirconium nitride (Zr), tungsten nitride (WN), or any alloy thereof.

The second interlayer insulating layer 140 may be disposed on the first interlayer insulating layer 130 to cover the first and second interconnection conductors IC1 and IC2 and the first and second conductive patterns CP1 and CP2. First and second upper plugs 141 and 143 may be disposed in the second interlayer insulating layer 140. The first upper plug 141 may be connected to the first conductive pattern CP1, and the second upper plug 143 may be connected to the second conductive pattern CP2.

First and second interconnections 145 and 147 extending in the y-axis direction may be disposed on the second interlayer insulating layer 140. The first interconnection 145 may be electrically connected to the common dopant region 123c through the first upper plug 141, the first conductive pattern CP1, and the common contact plug 133c. The second interconnection 147 may be electrically connected to the third dopant region 125a through the second upper plug 143, the second conductive pattern CP2, and the third contact plug 135a. In other words, the first interconnection 145 may be connected in common to the drain electrode of the reset transistor (RX of FIG. 2) and the drain electrode of the selection transistor (SX of FIG. 2), and the second interconnection 147 may be connected to the source electrode of the source follower transistor (DX of FIG. 2). That is, the power voltage (VDD of FIG. 2) may be applied to the first interconnection 145, and the electrical signal generated in the first or second pixel region PR1 or PR2 may be output through the second interconnection 147.

A third interlayer insulating layer 150 and a passivation layer 160 may be sequentially stacked on the second interlayer insulating layer 140 to cover the first and second interconnections 145 and 147.

Figure 6:
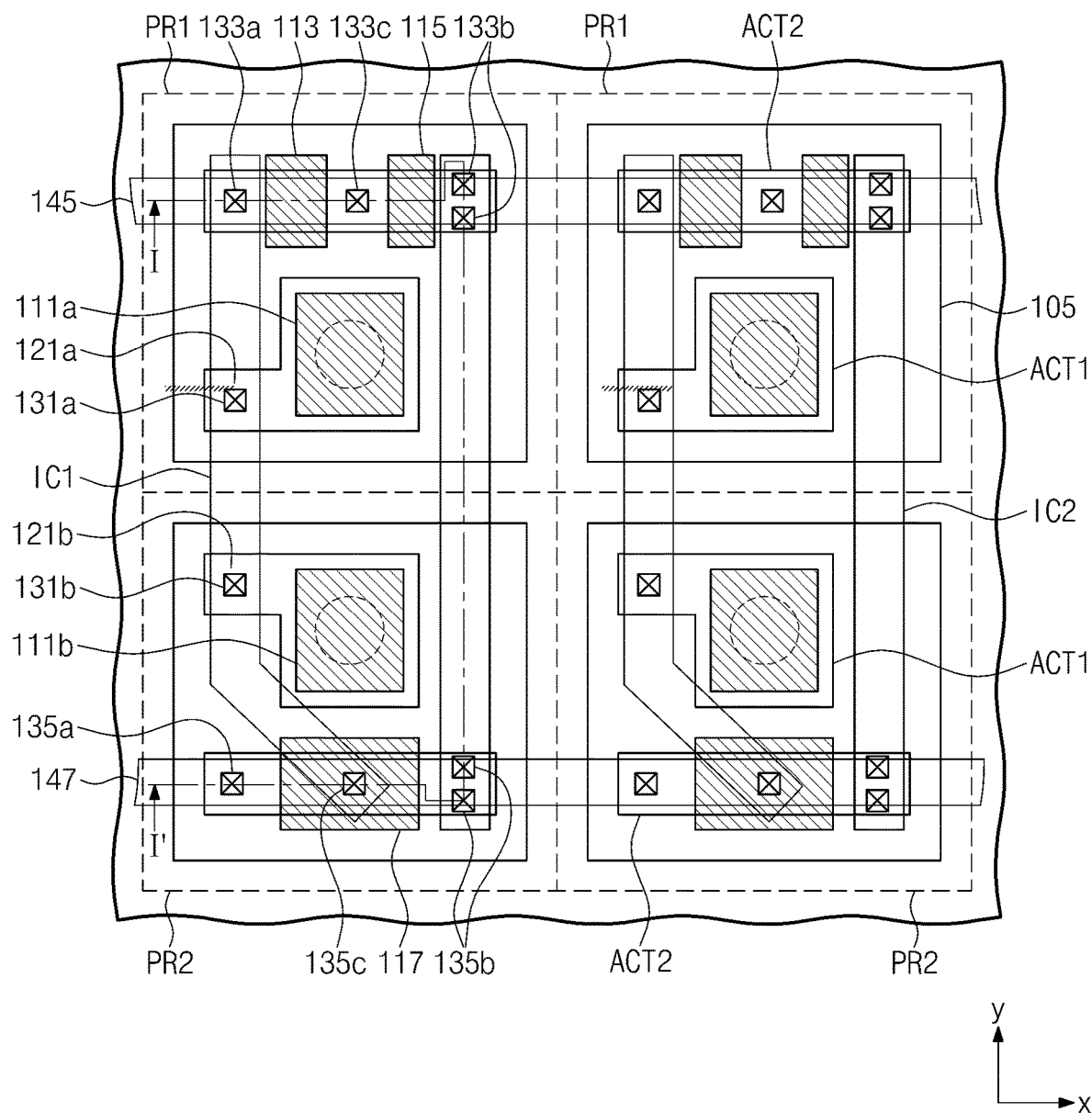
FIG. 6 is a schematic plan view illustrating a CMOS image sensor according to second embodiments of the inventive concepts.
Figure 7:
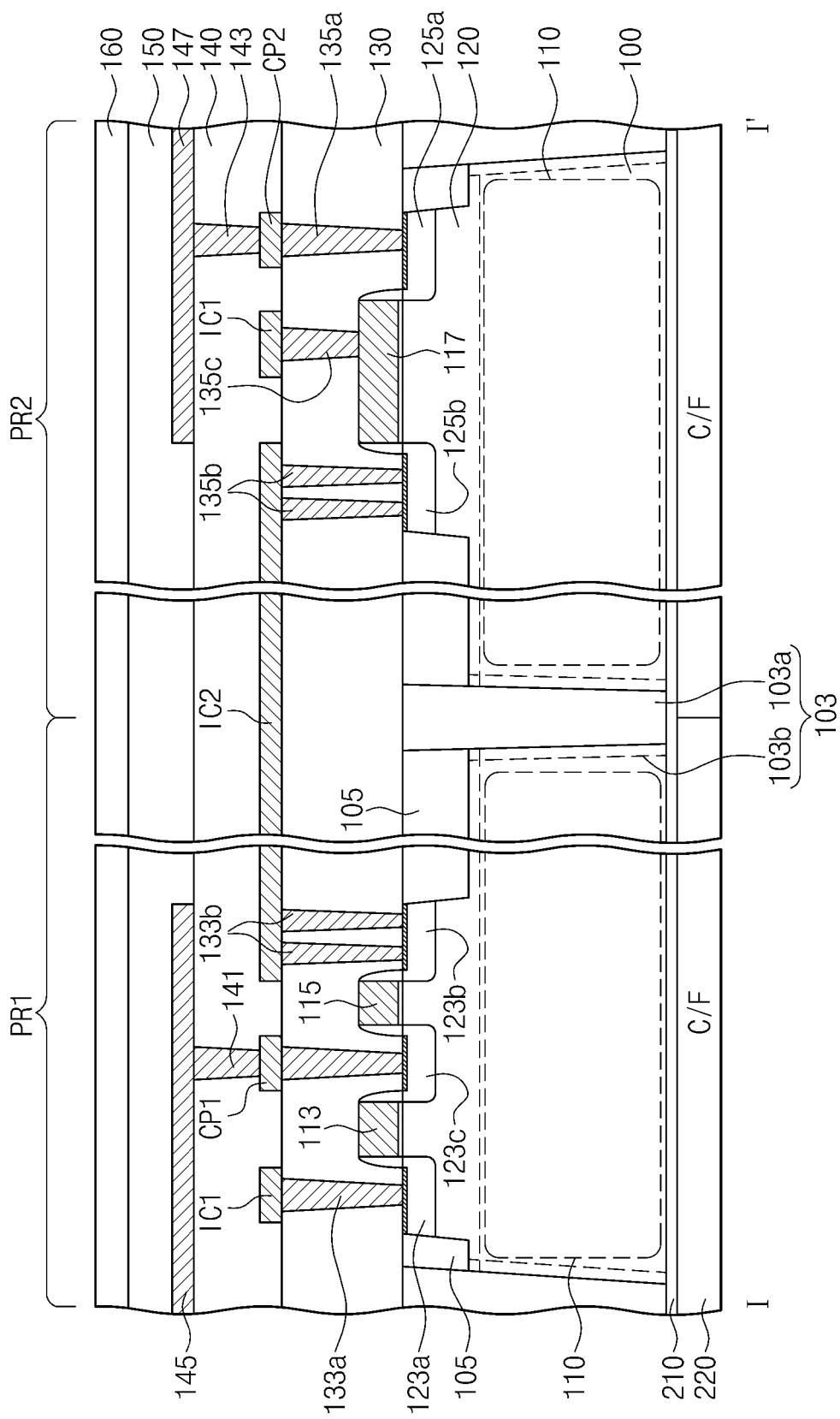
FIG. 7 is a cross-sectional view taken along a line I-I' of FIG. 6.
Figure 8:
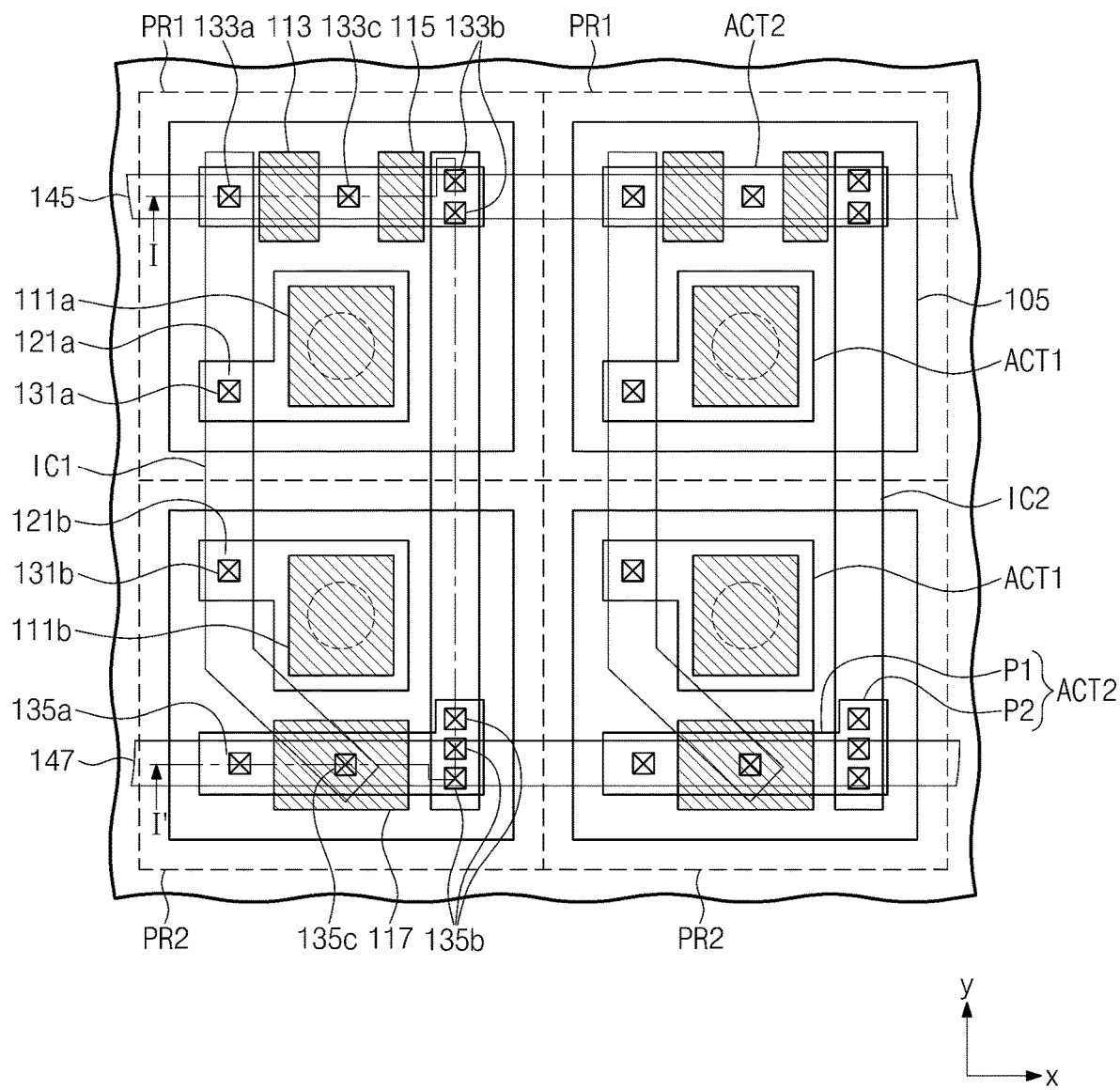
FIG. 8 is a schematic plan view illustrating a CMOS image sensor according to third embodiments of the inventive concepts.
Figure 9:
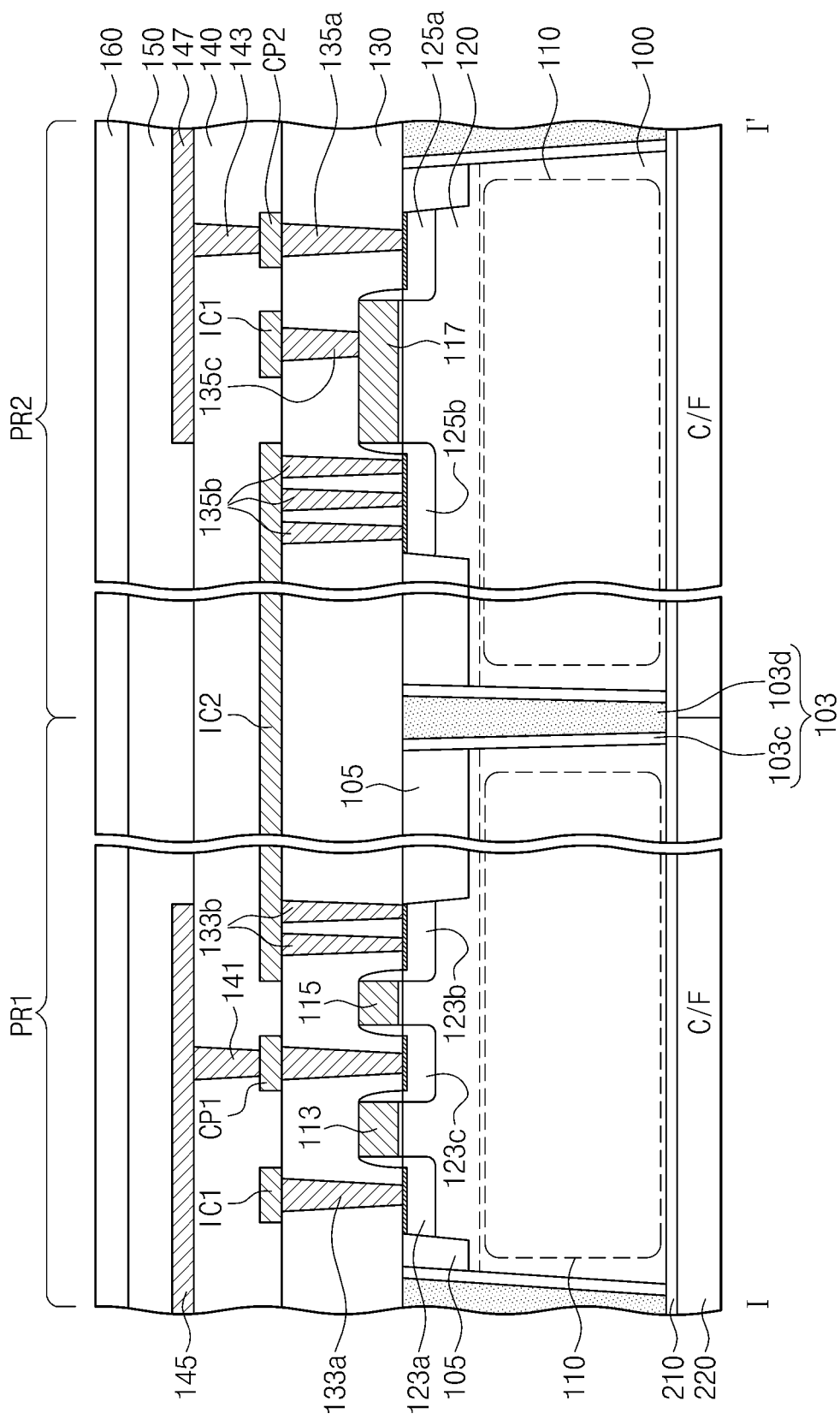
FIG. 9 is a cross-sectional view taken along a line I-I' of FIG. 8.

FIG. 6 is a schematic plan view illustrating a CMOS image sensor according to a second embodiments of the inventive concepts, and FIG. 7 is a cross-sectional view taken along a line I-I' of FIG. 6. FIG. 8 is a schematic plan view illustrating a CMOS image sensor according to third embodiments of the inventive concepts, and FIG. 9 is a cross-sectional view taken along a line I-I' of FIG. 8.

In embodiments illustrated in FIGS. 6 to 9, like items as described in FIGS. 3 to 5 are indicated by like reference numerals or reference designators, and repeated description of these items is selectively omitted in the following discussion.

Referring to FIGS. 6 and 7, a substrate 100 may include a first pixel region PR1 and a second pixel region PR2, and each of the first and second pixel regions PR1 and PR2 may include a first active portion ACT1 and a second active portion ACT2. In some embodiments, the first and second pixel regions PR1 and PR2 may be defined by a first device isolation layer 103, and the first and second active portions ACT1 and ACT2 may be defined by a second device isolation layer 105.

According to some embodiments, the first device isolation layer 103 may include an insulating layer 103a and a channel stop region 103b being in contact with a sidewall of the insulating layer 103a. The channel stop region 103b may be a dopant region heavily doped with P-type dopants. The channel stop region 103b may provide a potential barrier between adjacent pixels. The channel stop region 103b may prevent a dark current that may be caused in the case that the first device isolation layer 103 is formed in the deep trench formed in the substrate 100.

In some embodiments illustrated in FIGS. 8 and 9, a first device isolation layer 103 may include a silicon oxide layer 103c and an undoped poly-silicon layer 103d. In still other embodiments, a first device isolation layer 103 may include an insulating layer and an air gap partially formed in the deep trench. In further embodiments, a first device isolation layer 103 may be a dopant region heavily doped with P-type dopants. In other words, the dopant region heavily doped with P-type dopants (i.e., the first device isolation layer 103) may be formed to surround the photoelectric conversion layer 110.

According to some embodiments of the inventive concepts, the photoelectric conversion layer 110 and the well dopant layer 120 may be formed in the substrate 100 of each of the first and second pixel regions PR1 and PR2. The first transfer gate 111a and the first floating diffusion region 121a may be disposed at the first active portion ACT1 of the first pixel region PR1, and the second transfer gate 111b and the second floating diffusion region 121b may be disposed at the first active portion ACT1 of the second pixel region PR2. The reset gate 113 and the selection gate 115 may be disposed on the second active portion ACT2 of the first pixel region PR1, and the source follower gate 117 may be disposed on the second active portion ACT2 of the second pixel region PR2. As described above, the second active portions ACT2 of the first and second pixel regions PR1 and PR2 may have the substantially same width and the substantially same length, and the length of the source follower gate 117 may be greater than the lengths of the reset gate 113 and the selection gate 115.

In some embodiments, the reset transistor (RX of FIG. 2) of the first pixel region PR1 may be connected in common to the first and second floating diffusion regions 121a and 121b, and the source follower gate 117 of the second pixel region PR2 may be connected in common to the first and second floating diffusion regions 121a and 121b. In other words, the first interconnection conductor IC1 may be electrically connected to the first dopant region 123a of the first pixel region PR1, the first and second floating diffusion regions 121a and 121b, and the source follower gate 117. The selection transistor (SX of FIG. 2) of the first pixel region PR1 may be connected in series to the source follower transistor (DX of FIG. 2) of the second pixel region PR2. Thus, the second interconnection conductor IC2 may be electrically connected to the second dopant region 123b of the first pixel region PR1 and the fourth dopant region 125b of the second pixel region PR2.

According to some embodiments of the inventive concepts, when the selection transistor (SX of FIG. 2) is turned-on, the power voltage VDD applied to the common dopant region 123c through the first interconnection 145 may be provided to the fourth dopant region 125b through the second dopant region 123b and the second interconnection conductor IC2. This may cause a potential difference between the second dopant region 123b and the fourth dopant region 125b due to RC delay. Plural second contact plugs 133b connecting the second dopant region 123b to the second interconnection conductor IC2 may be provided to reduce the potential difference caused by the RC delay. Likewise, plural fourth contact plugs 135b connecting each of the fourth dopant regions 125b to the second interconnection conductors IC2 may also be provided to reduce the potential difference. In the embodiment of FIGS. 6 and 7, the number of the second contact plugs 133b may be equal to the number of the fourth contact plugs 135b. In other embodiments, the number of the second contact plugs 133b may be different from the number of the fourth contact plugs 135b, as illustrated in FIGS. 8 and 9. For example, the number of the fourth contact plugs 135b may be more than the number of the second contact plugs 133b.

In some embodiments as illustrated in FIGS. 8 and 9, the second active portion ACT2 of the second pixel region PR2 may have a portion with increased width to accommodate contact plugs. In more detail, the second active portion ACT2 of the second pixel region PR2 may include a first portion P1 extending in the x-axis direction, and a second portion P2 protruding from one end of the first portion P1 in the y-axis direction, and a width of the second portion P2 may be greater than the first portion P1. The plurality of fourth contact plugs 135b may be disposed on the second portion P2.

Figure 10:
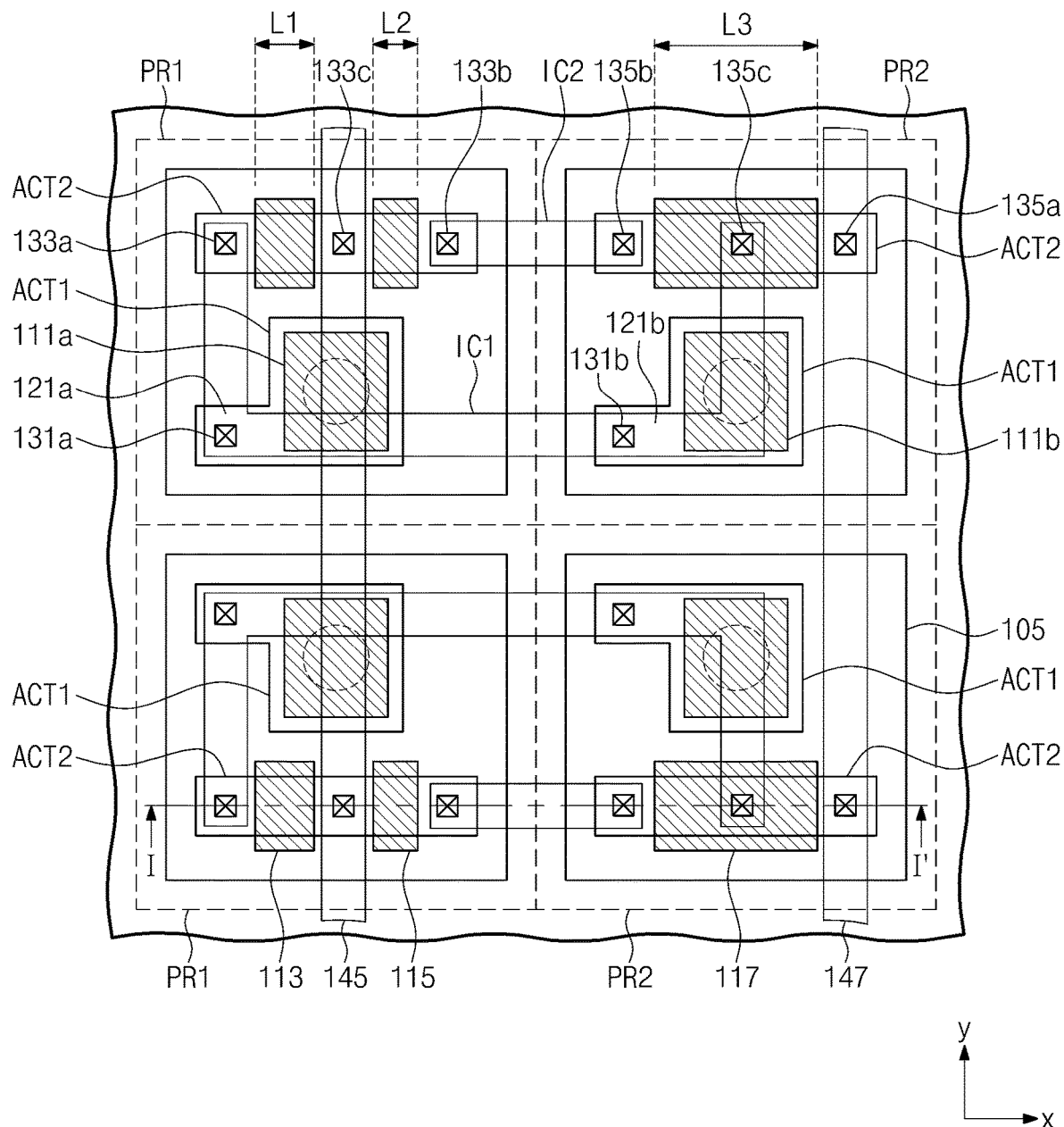
FIG. 10 is a schematic plan view illustrating a CMOS image sensor according to fourth embodiments of the inventive concepts.
Figure 11:
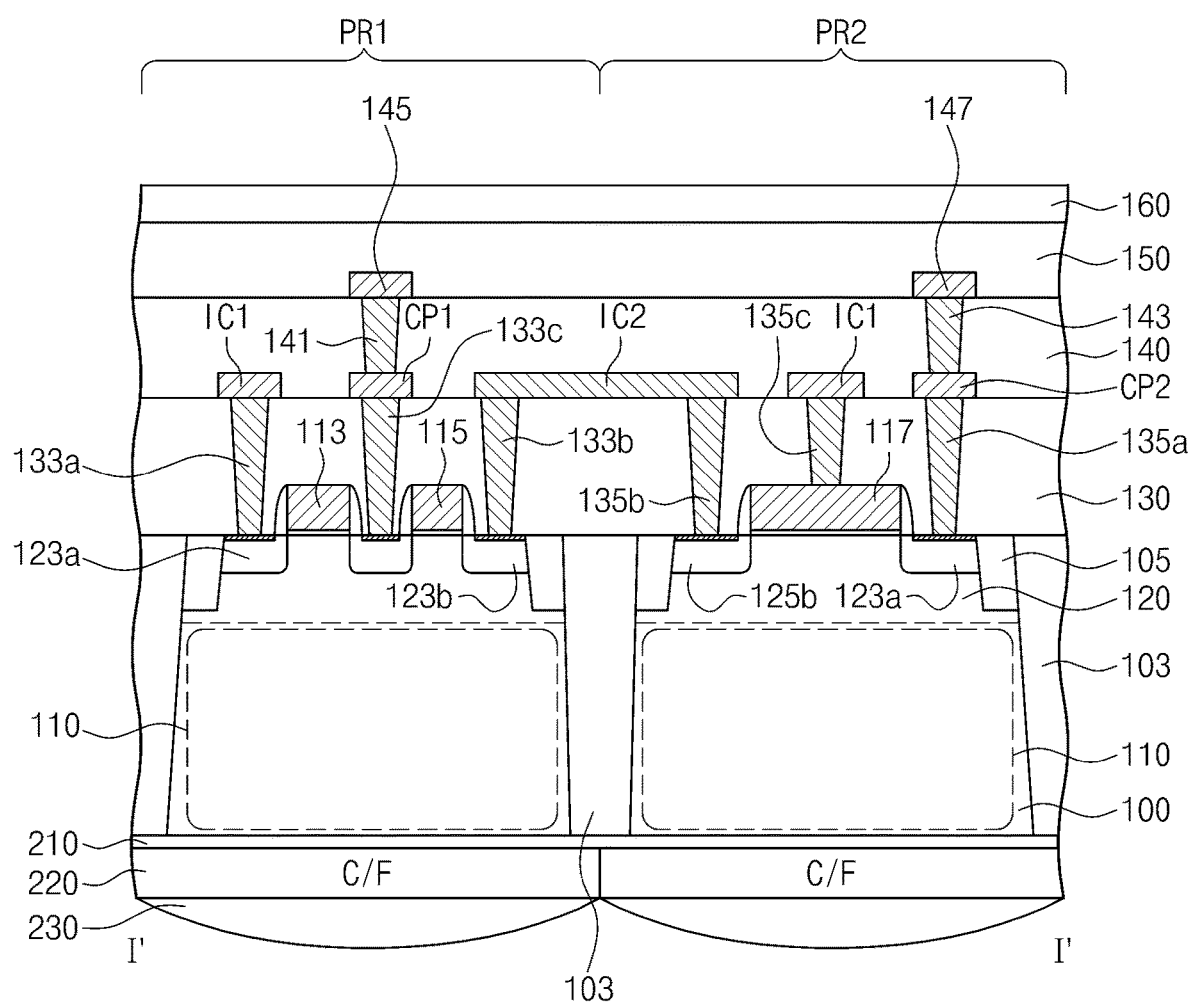
FIG. 11 is a cross-sectional view taken along a line I-I' of FIG. 10.

FIG. 10 is a schematic plan view illustrating a CMOS image sensor according to fourth embodiments of the inventive concepts, and FIG. 11 is a cross-sectional view taken along a line I-I' of FIG. 10.

Referring to FIGS. 10 and 11, first pixel regions PR1 may be distributed along a y-axis direction, and second pixel regions PR2 may be distributed along a y-axis direction. The first and second pixel regions PR1 and PR2 may be alternately arranged along the x-axis direction. In plan view, first active portions ACT1 of the first and second pixel regions PR1 and PR2 arranged along the x-axis direction may be adjacent one another, and second active portions ACT2 of the first and second pixel regions PR1 and PR2 may be adjacent one another. In other words, the first active portions ACT1 of the first and second pixel regions PR1 and PR2 may be arranged in the x-axis direction, and the second active portions ACT2 of the first and second pixel regions PR1 and PR2 may be arranged in the x-axis direction.

The first and second pixel regions PR1 and PR2 may be defined by the first device isolation layer 103, and the first and second active portions ACT1 and ACT2 may be defined by the second device isolation layer 103.

According to some embodiments of the inventive concepts, a first transfer gate 111a and a first floating diffusion region 121a may be disposed at the first active portion ACT1 of the first pixel region PR1, and a second transfer gate 111b and a second floating diffusion region 121b may be disposed at the first active portion ACT1 of the second pixel region PR2.

A reset gate 113 and a selection gate 115 may be disposed on the second active portion ACT2 of the first pixel region PR1, and a source follower gate 117 may be disposed on the second active portion ACT2 of the second pixel region PR2. As described above, the second active portions ACT2 of the first and second pixel regions PR1 and PR2 may have the substantially same width and the substantially same length, and the length of the source follower gate 117 may be greater than the lengths of the reset gate 113 and the selection gate 115.

A first interconnection conductor IC1 may be connected in common to the first and second floating diffusion regions 121a and 121b, the first dopant region 123a of the first pixel region PR1, and the source follower gate 117 of the second pixel region PR2. A second interconnection conductor IC2 may be electrically connected to the second dopant region 123b of the first pixel region PR1 and the fourth dopant region 125b of the second pixel region PR2. In the illustrated embodiments, since the second active portion ACT2 of the first pixel region PR1 is adjacent the second active portion ACT2 of the second pixel region PR2, a distance between the second dopant region 123b formed in the second active portion ACT2 of the first pixel region PR1 and the fourth dopant region 125b formed in the second active portion ACT2 of the second pixel region PR2 may be reduced. In other words, a length of the second interconnection conductor IC2 connecting the second dopant region 123b to the fourth dopant region 125b can be reduced, so the potential difference between the second and fourth dopant regions 123b and 125b may be reduced when the image sensor operates.

In the illustrated embodiments, the first interconnection 145 may extend along the y-axis direction and may be connected to the common dopant region 123c. The second interconnection 147 may extend along the y-axis direction and may be connected to the third dopant region 125a.

Figure 12:
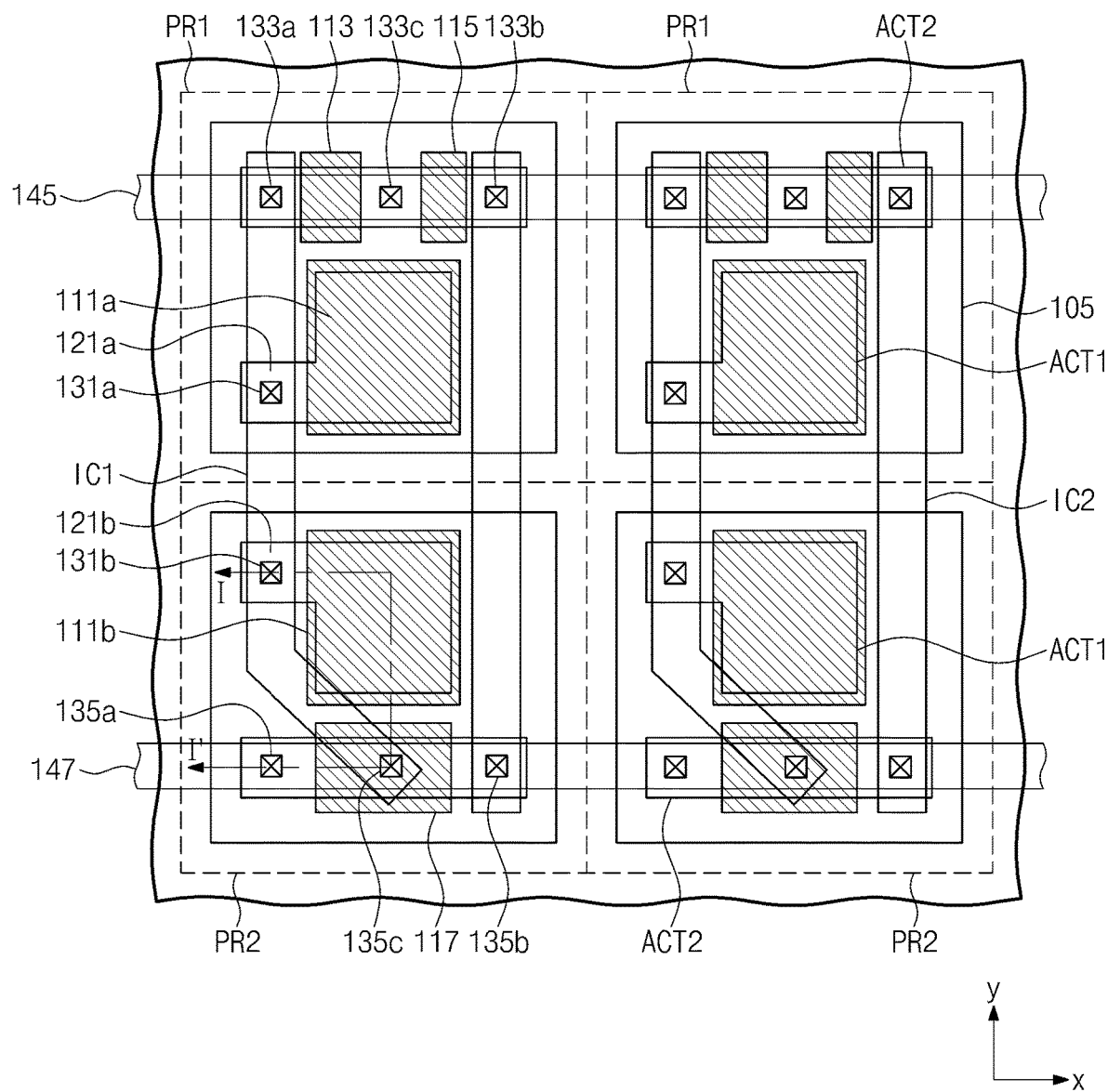
FIG. 12 is a schematic plan view illustrating a CMOS image sensor according to a fifth embodiments of the inventive concepts.
Figure 13:
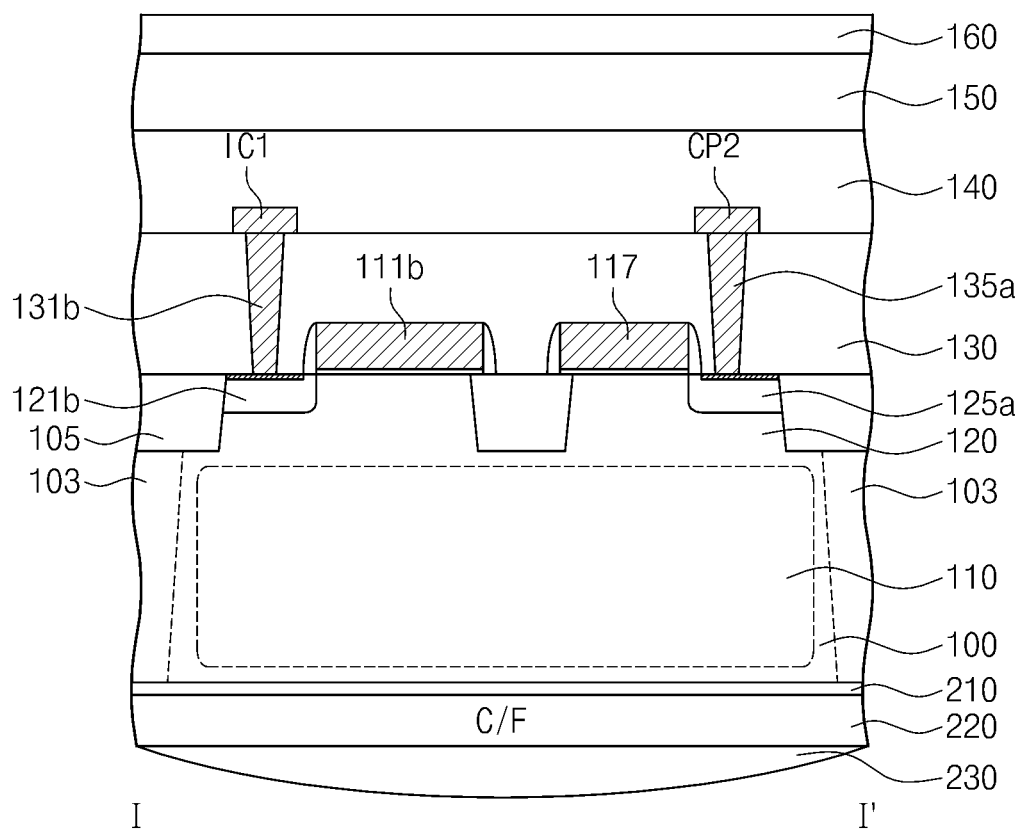
FIG. 13 is a cross-sectional view taken along a line I-I' of FIG. 12.

FIG. 12 is a schematic plan view illustrating a CMOS image sensor according to fifth embodiments of the inventive concepts, and FIG. 13 is a cross-sectional view taken along a line I-I' of FIG. 12.

Referring to FIGS. 12 and 13, the substrate 100 may include a first pixel region PR1 and a second pixel region PR2, and each of the first and second pixel regions PR1 and PR2 may include a first active portion ACT1 and a second active portion ACT2. In some embodiments, the first and second pixel regions PR1 and PR2 may be defined by a first device isolation layer 103, and the first and second active portions ACT1 and ACT2 may be defined by a second device isolation layer 105. The first device isolation layer 103 may be a dopant region heavily doped with P-type dopants, and the second device isolation layer 105 may be formed to be adjacent to the first surface 101a of the substrate 100 on the first device isolation layer 103.

According to some embodiments of the inventive concepts, the photoelectric conversion layer 110 and the well dopant layer 120 may be formed in the substrate 100 of the first and second pixel regions PR1 and PR2. The first transfer gate 111a and the first floating diffusion region 121a may be disposed at the first active portion ACT1 of the first pixel region PR1, and the second transfer gate 111b and the second floating diffusion region 121b may be disposed at the first active portion ACT1 of the second pixel region PR2.

The first and second transfer gates 111a and 111b may be disposed on the first surface 101a of the substrate 100. In other words, the first and second transfer gates 111a and 111b may be disposed on the well dopant layer 120 with a gate insulating layer interposed therebetween. Each of the first and second transfer gates 111a and 111b may be disposed on the rest portion of the first active portion ACT1 except each of the first and second floating diffusion regions 121a and 121b.

The reset gate 113 and the selection gate 115 may be disposed on the second active portion ACT2 of the first pixel region PR1, and the source follower gate 117 may be disposed on the second active portion ACT2 of the second pixel region PR2. As described above, the second active portions ACT2 of the first and second pixel regions PR1 and PR2 may have the substantially same width and the substantially same length, and the length of the source follower gate 117 may be greater than the lengths of the reset gate 113 and the selection gate 115.

According to some embodiments, the first interconnection conductor IC1 may be electrically connected to the first and second floating diffusion regions 121a and 121b, the source electrode of the reset transistor (RX of FIG. 2) of the first pixel region PR1, and the source follower gate 117 of the second pixel region PR2. The selection transistor (SX of FIG. 2) of the first pixel region PR1 may be connected in series to the source follower transistor (DX of FIG. 2) of the second pixel region PR2 through the second interconnection conductor IC2.

Figure 14:
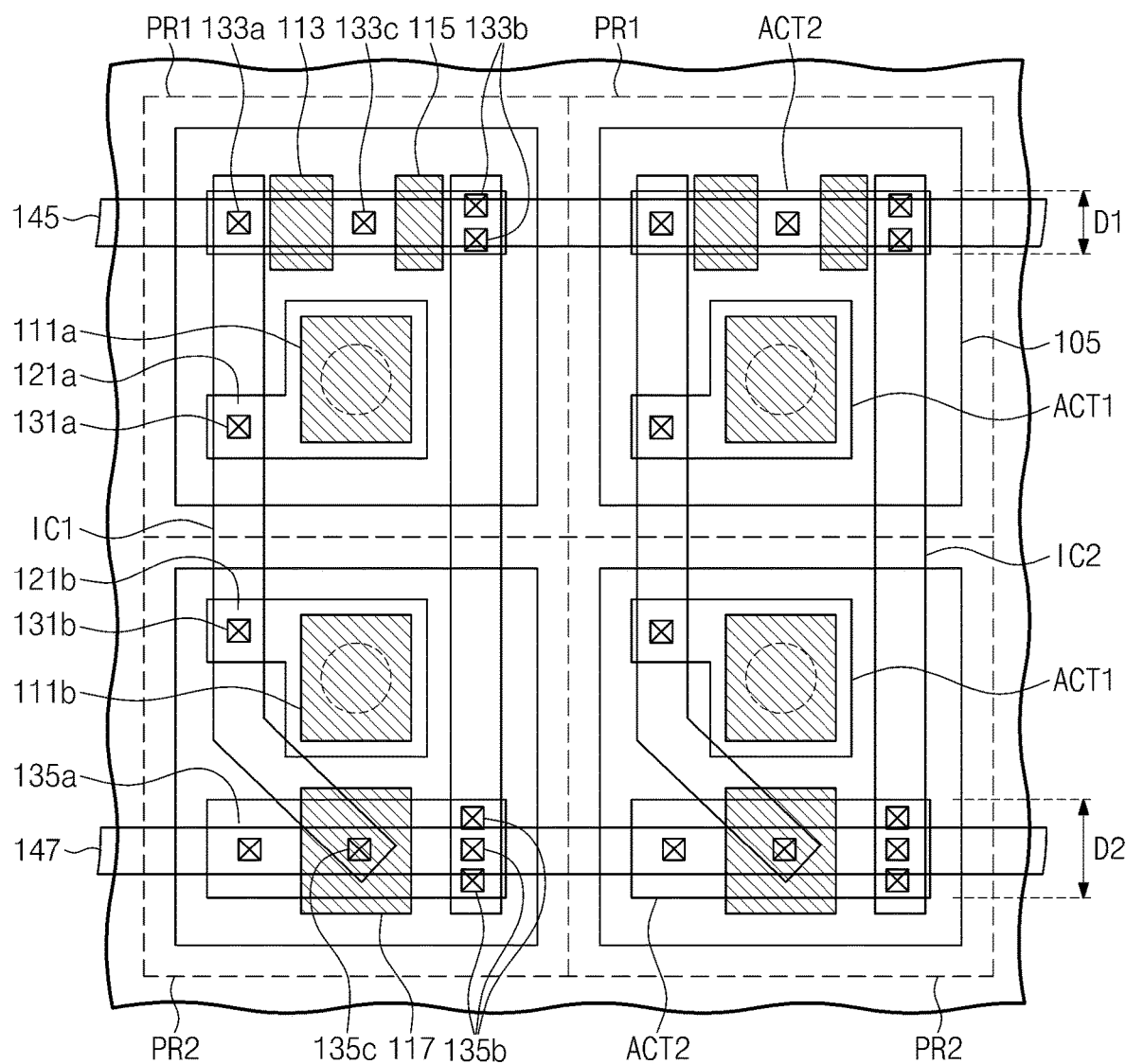
FIG. 14 is a schematic plan view illustrating a CMOS image sensor according to sixth embodiments of the inventive concepts.
Figure 14:
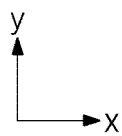

FIG. 14 is a schematic plan view illustrating a CMOS image sensor according to sixth embodiments of the inventive concepts. Like items in FIG. 14 and n FIGS. 3 to 5 are indicated by like reference numerals or reference designators, and repeated descriptions of these like items are selectively omitted in the following discussion.

As illustrated in FIG. 14, areas of the first and second pixel regions PR1 and PR2 may be equal, but an area of the second active portion ACT2 of the first pixel region PR1 may be different from an area of the second active portion ACT2 of the second pixel region PR2. For example, a width D2 of the second active portion ACT2 of the second pixel region PR2 may be greater than a width D1 of the second active portion ACT2 of the first pixel region PR1. The reset gate 113 and the selection gate 115 may be disposed on the second active portion ACT2 of the first pixel region PR1, and the source follower gate 117 may be disposed on the second active portion ACT2 of the second pixel region PR2. The length of the source follower gate 117 may be greater than the lengths of the reset gate 113 and the selection gate 115. In some embodiments, the length of the source follower gate 117 may be substantially equal to the length of the reset gate 113.

The second contact plugs 133b may be connected to the second dopant region 123b which is formed in the second active portion ACT2 at a side of the selection gate 115. The fourth contact plugs 135b may be connected to the fourth dopant region 125b which is formed in the second active portion ACT2 at a side of the source follower gate 117. The number of the fourth contact plugs 135b may be more than the number of the second contact plugs 133b.

Figure 15:
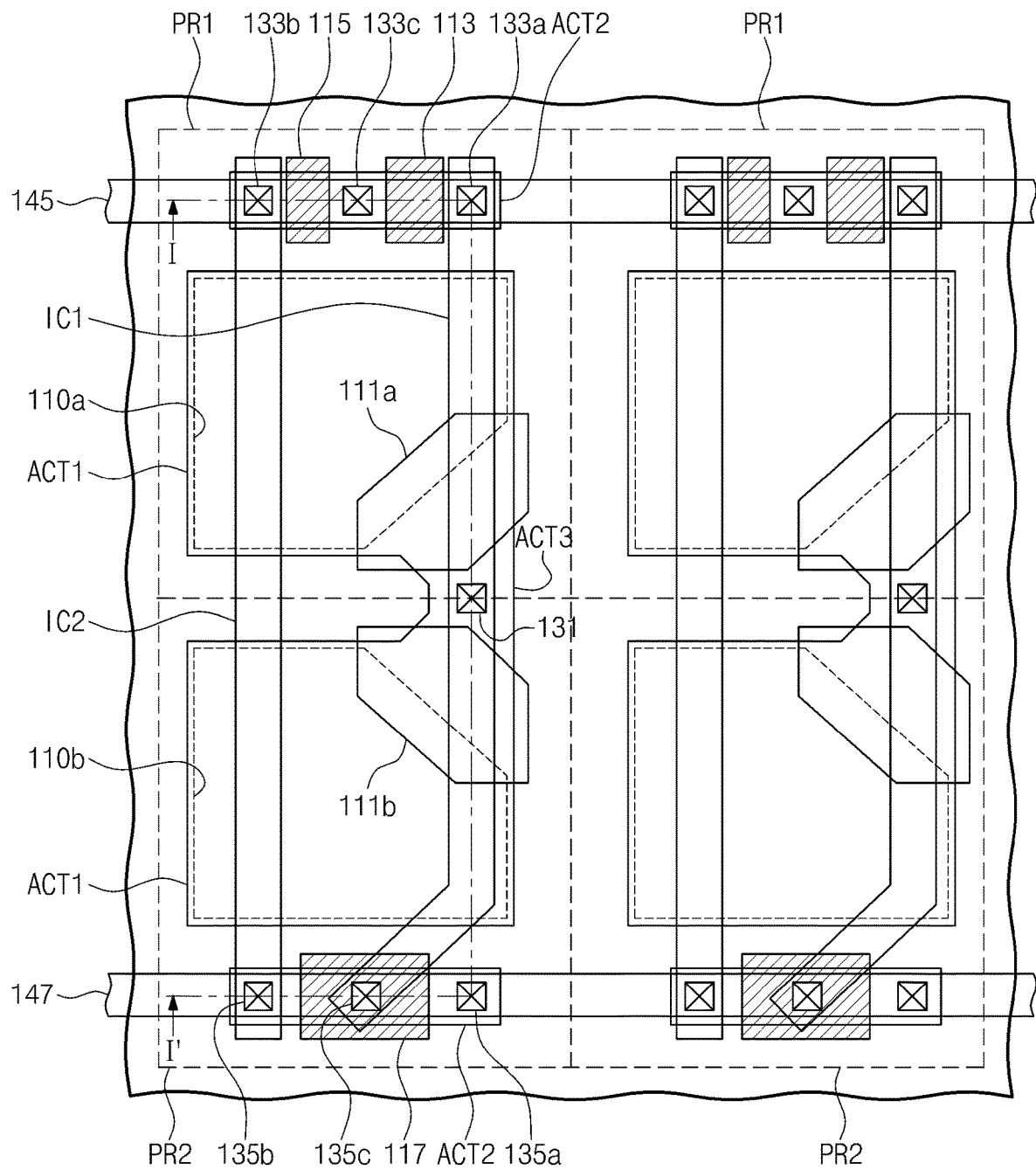
FIG. 15 is a schematic plan view illustrating a CMOS image sensor according to seventh embodiments of the inventive concepts.
Figure 15:
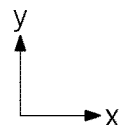
Figure 16:
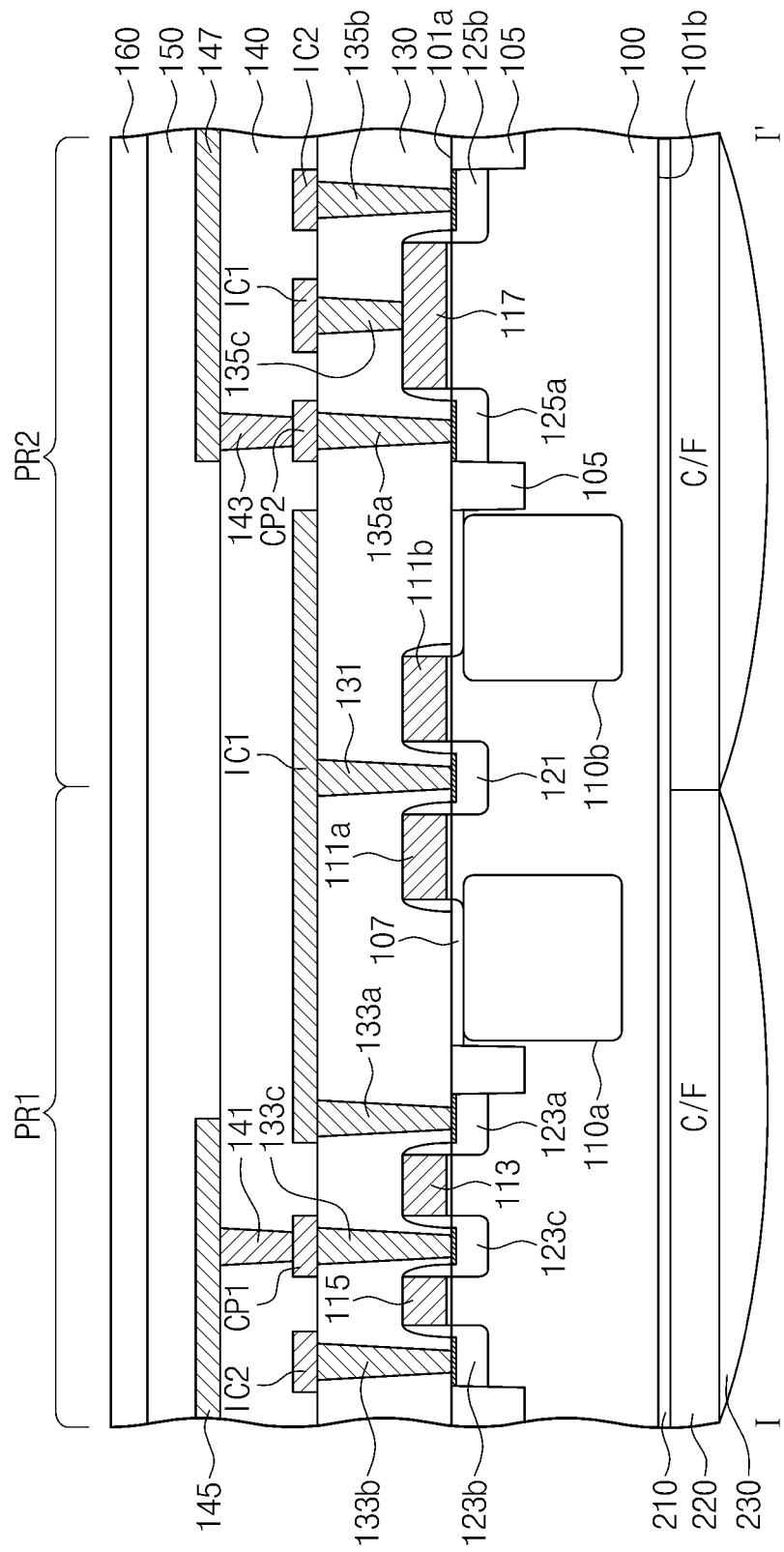
FIG. 16 is a cross-sectional view taken along a line I-I' of FIG. 15.

FIG. 15 is a schematic plan view illustrating a CMOS image sensor according to seventh embodiments of the inventive concepts, and FIG. 16 is a cross-sectional view taken along a line I-I' of FIG. 15.

Referring to FIGS. 15 and 16, a substrate 100 may include a first pixel region PR1 and a second pixel region PR2. A plurality of first pixel regions PR1 may be provided, and the plurality of first pixel regions PR1 may be distributed along an x-axis direction. A plurality of second pixel regions PR2 may be provided, and the plurality of second pixel regions PR2 may be distributed along the x-axis direction. The first and second pixel regions PR1 and PR2 may be alternately arranged along a y-axis direction.

According to some embodiments, each of the first and second pixel regions PR1 and PR2 may include a first active portion ACT1 and a second active portion ACT2. The first active portions ACT1 of the first and second pixel regions PR1 and PR2 may be adjacent one another. The first active portions ACT1 of the first and second pixel regions PR1 and PR2 may be connected in common to a common active portion ACT3.

In some embodiments, the first active portions ACT1, the second active portions ACT2, and the common active portion ACT3 of the first and second pixel regions PR1 and PR2 may be defined by a device isolation layer 105 which is formed in the substrate 100. A bottom surface of the device isolation layer 105 may be disposed between the first surface 101a and the second surface 101b of the substrate 100. For example, the first surface 101a of the substrate 100 may be patterned to form a shallow trench, and the device isolation layer 105 may be formed by filling the shallow trench with an insulating material.

Photoelectric conversion layers 110a and 110b may be formed in the substrate 100 of the first and second pixel regions PR1 and PR2, respectively. In some embodiments, a first photoelectric conversion layer 110a may be formed in the first active portion ACT1 of the first pixel region PR1, and a second photoelectric conversion layer 110b may be formed in the first active portion ACT1 of the second pixel region PR2. The substrate 100 may be an epitaxial layer having a first conductivity type, and the first and second photoelectric conversion layers 110a and 110b may be dopant regions having a second conductivity type. A dopant region 107 having the first conductivity type may be formed on each of the first and second photoelectric conversion layers 110a and 110b to prevent a dark current.

A common floating diffusion region 121 may be formed in the common active portion ACT3 by ion-implanting dopants of which a conductivity type is opposite to that of the well dopant layer 120. For example, the common floating diffusion region 121 may be an N-type dopant region.

A first transfer gate 111a may be disposed on the substrate 100 between the common floating diffusion region 121 and the first photoelectric conversion layer 110a of the first pixel region PR1, and a second transfer gate 111b may be disposed on the substrate 100 between the common floating diffusion region 121 and the second photoelectric conversion layer 110b of the second pixel region PR2.

A reset gate 113 and a selection gate 115 may be disposed on the second active portion ACT2 of the first pixel region PR1, and a source follower gate 117 may be disposed on the second active portion ACT2 of the second pixel region PR2. As described above, the second active portions ACT2 of the first and second pixel regions PR1 and PR2 may have the substantially same width and the substantially same length. In addition, the length of the source follower gate 117 may be greater than lengths of the reset gate 113 and the selection gate 115.

A first dopant region 123a may be formed in the substrate 100 at a side of the reset gate 123a, and a second dopant region 123b may be formed in the substrate 100 at a side of the selection gate 115. A common dopant region 123c may be formed in the substrate 100 between the reset and selection gates 113 and 115. A third dopant region 125a may be formed in the substrate 100 at a side of the source follower gate 117, and a fourth dopant region 125b may be formed in the substrate 100 at another side of the source follower gate 117. In some embodiments, the first to fourth dopant regions 123a, 123b, 125a, and 125b and the common dopant region 123c may be formed by ion-implanting dopants of which a conductivity type is opposite to that of the substrate 100. For example, the first to fourth dopant regions 123a, 123b, 125a, and 125b and the common dopant region 123c may be N-type dopant regions.

According to some embodiments, a first contact plug 133a may be connected to the first dopant region 123a, and a second contact plug 133b may be connected to the second dopant region 123b. A common contact plug 133c may be connected to the common dopant region 123c. A third contact plug 135a may be connected to the third dopant region 125a, and a fourth contact plug 135b may be connected to the fourth dopant region 125b. A gate contact plug 135c may be connected to the source follower gate 117. In addition, a FD contact plug 131 may be connected to the common floating diffusion region 121.

In some embodiments, the reset transistor (RX of FIG. 2) of the first pixel region PR1 may be connected to the common floating diffusion region 121, and the source follower gate 117 of the second pixel region PR2 may be connected to the common floating diffusion region 121. In other words, a first interconnection conductor IC1 may be electrically connected to the first dopant region 123a of the first pixel region PR1, the common floating diffusion region 121, and the source follower gate 117. The first interconnection conductor IC1 may be electrically connected to the common floating diffusion region 121 through the FD contact plug 131. In addition, the first interconnection conductor IC1 may be electrically connected to the first dopant region 123a and the source follower gate 117 through the first contact plug 133a and the gate contact plug 135c, respectively.

In some embodiments, the selection transistor (SX of FIG. 2) of the first pixel region PR1 may be connected in series to the source follower transistor (DX of FIG. 2) of the second pixel region PR2. Thus, a second interconnection conductor IC2 may electrically connect the second dopant region 123b of the first pixel region PR1 to the fourth dopant region 125b of the second pixel region PR2. In other words, the second interconnection conductor IC2 may be electrically connected to the second dopant region 123b and the fourth dopant region 125b through the second contact plug 133b and the fourth contact plug 135b, respectively.

First and second interconnections 145 and 147 extending in the x-axis direction may be disposed on the second interlayer insulating layer 140. The first interconnection 145 may be electrically connected to the common dopant region 123c through the first upper plug 141, the first conductive pattern CP1, and the common contact plug 133c. The second interconnection 147 may be electrically connected to the third dopant region 125a through the second upper plug 143, the second conductive pattern CP2, and the third contact plug 135a.

Figure 17:
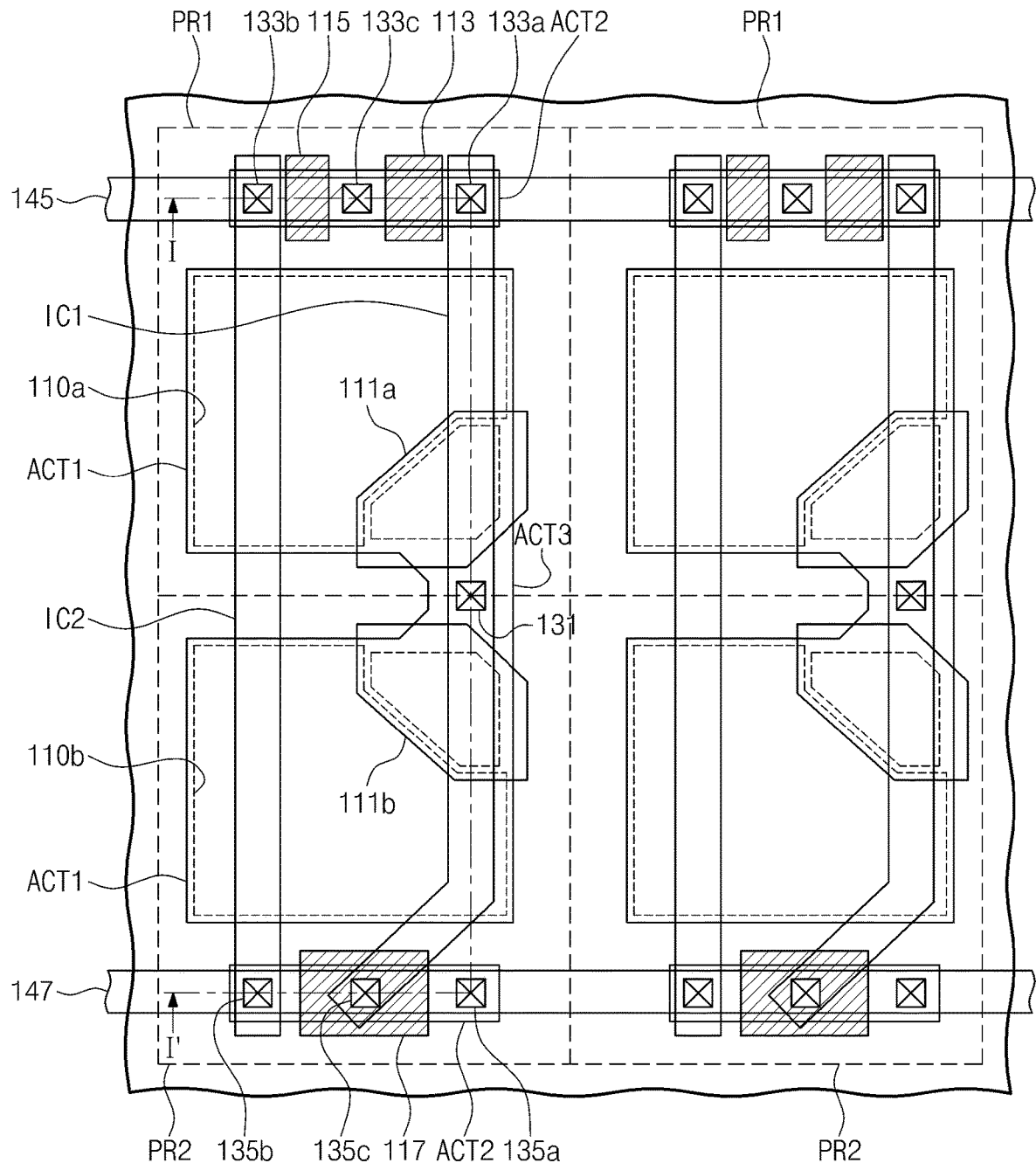
FIG. 17 is a schematic plan view illustrating a CMOS image sensor according to eighth embodiments of the inventive concepts.
Figure 18:
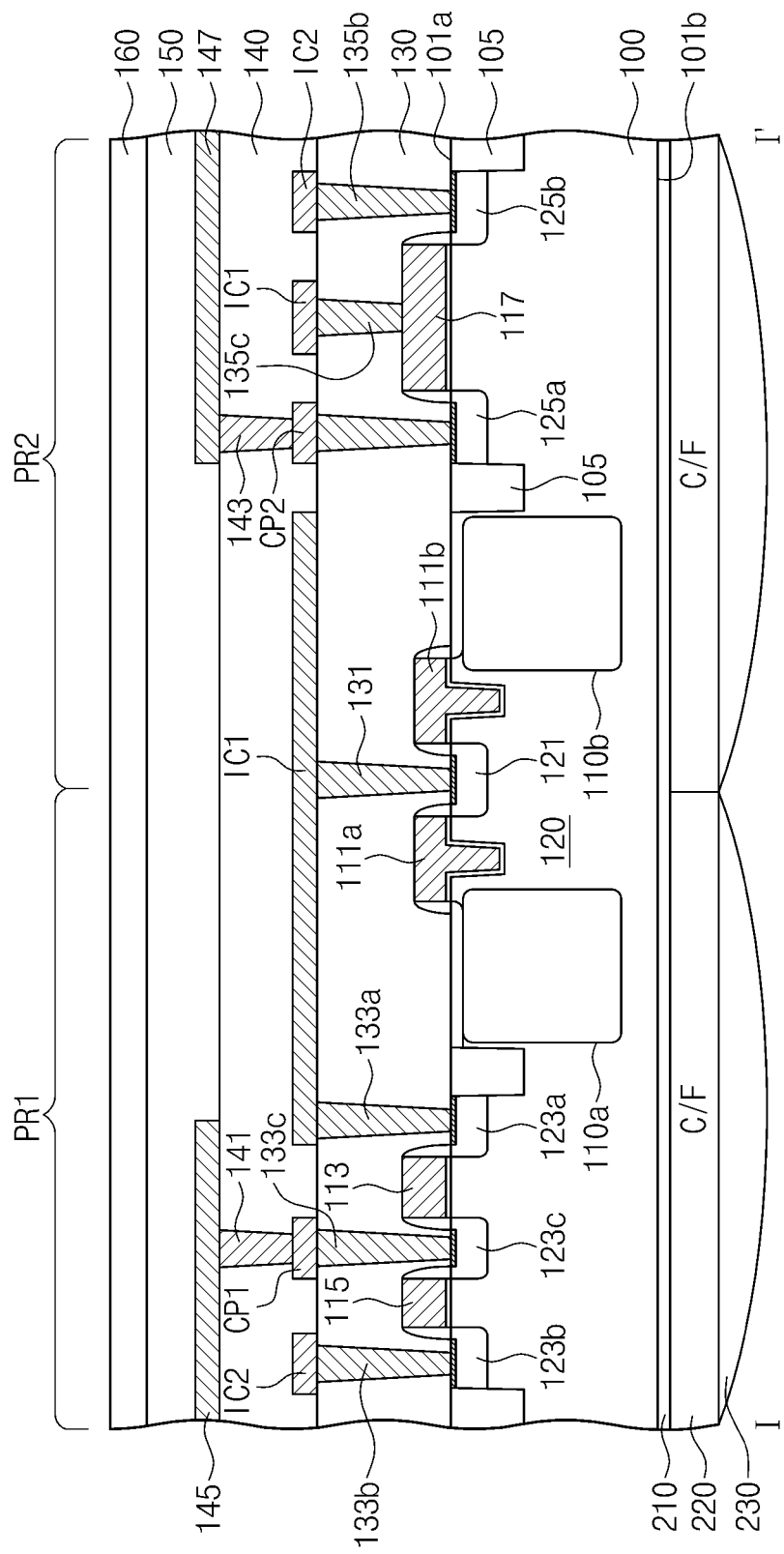
FIG. 18 is a cross-sectional view taken along a line I-I' of FIG. 17.

FIG. 17 is a schematic plan view illustrating a CMOS image sensor according to eighth embodiments of the inventive concepts, and FIG. 18 is a cross-sectional view taken along a line I-I' of FIG. 17.

Like items in FIG. 17 and FIGS. 15 and 16 are indicated by like reference numerals or reference designators and repeated descriptions of these like items may be selectively omitted.

Referring to FIGS. 17 and 18, portions of first and second transfer gates 111a and 111b may be inserted into the substrate 100. In other words, each of the first and second transfer gates 111a and 111b may include a lower portion extending into the substrate 100, and an upper portion connected to the lower portion and protruding from the first surface 101a of the substrate 100. In some embodiments, the lower portions of the first and second transfer gates 111a and 111b may penetrate portions of the well dopant layer 120. The gate insulating layer may be disposed between the substrate 100 and the first and second transfer gates 111a and 111b. In some embodiments, trenches may be formed in the well dopant layers 120 exposed at the first active portions ACT1, and a gate insulating layer and a gate conductive layer may be formed on the substrate 100 to fill the trenches. The gate conductive layer may be patterned to form the first and second transfer gates 111a and 111b.

In some embodiments, the first and second transfer gates 111a and 111b may be adjacent to sidewalls of the photoelectric conversion layers 110a and 110b. In addition, bottom surfaces of the first and second transfer gates 111a and 111b may be spaced apart from top surfaces of the first and second photoelectric conversion layers 110a and 110b.

Figure 19:
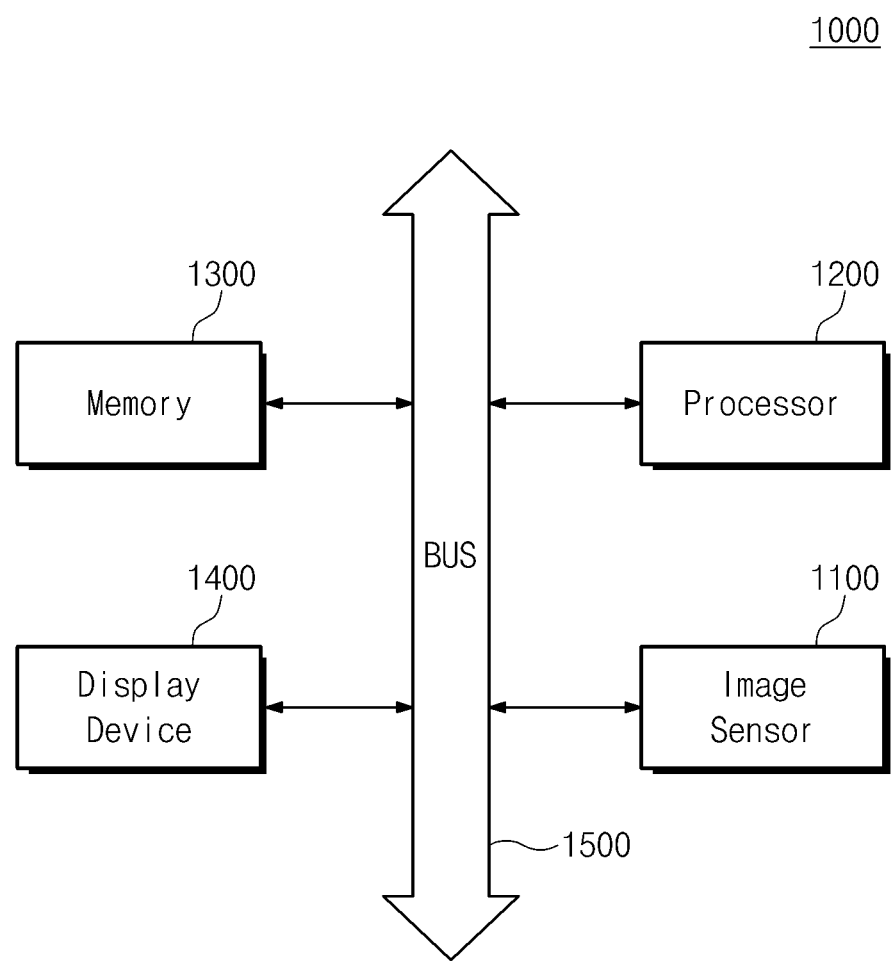
FIG. 19 is a schematic block diagram illustrating a processor-based system including a CMOS image sensor according to some embodiments of the inventive concepts.

FIG. 19 is a schematic block diagram illustrating a processor-based system including a CMOS image sensor according to embodiments of the inventive concepts.

Referring to FIG. 19, a processor-based system 1000 may include an image sensor 1100, a processor 1200, a memory device 1300, a display unit 1400, and a system bus 1500. The image sensor 1100 may capture external image information in response to controlling signals of the processor 1200. The processor 1200 may store the captured image information in the memory device 1300 through the system bus 1500. The processor 1200 may display the image information stored in the memory device 1300 on the display unit 1400.

The system 1000 may be realized as a computer system, a camera system, a scanner, a mechanized clock system, a navigation system, a video phone, a monitoring system, an auto-focus system, a tracking system, a movement sensing system, or an image stabilizing system. However, the inventive concepts are not limited thereto. If the processor-based system 1000 is applied to a mobile device, a battery for supplying an operating voltage to the mobile device may be added into the system 1000.

Figure 20:
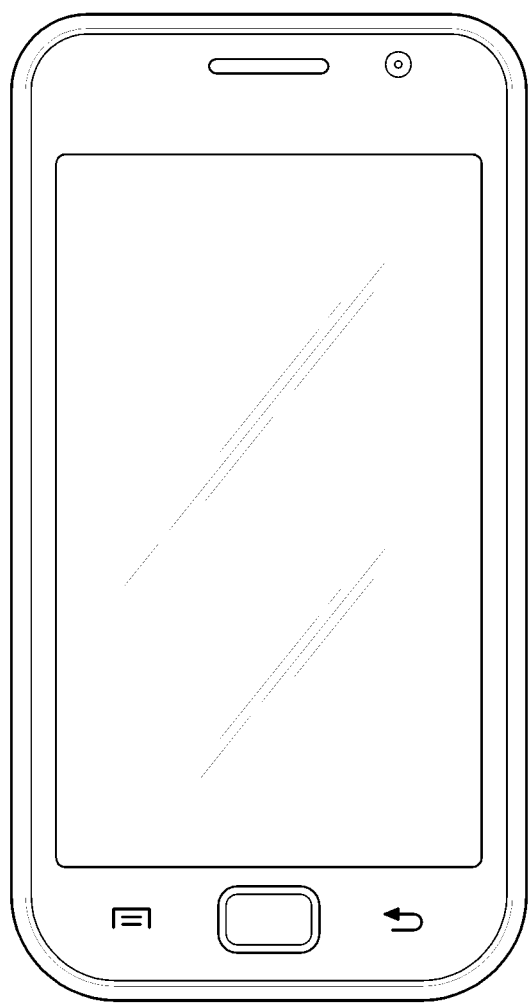
FIGS. 20 and 21 illustrate electronic devices implemented with image sensors according to some embodiments of the inventive concepts.
Figure 21:
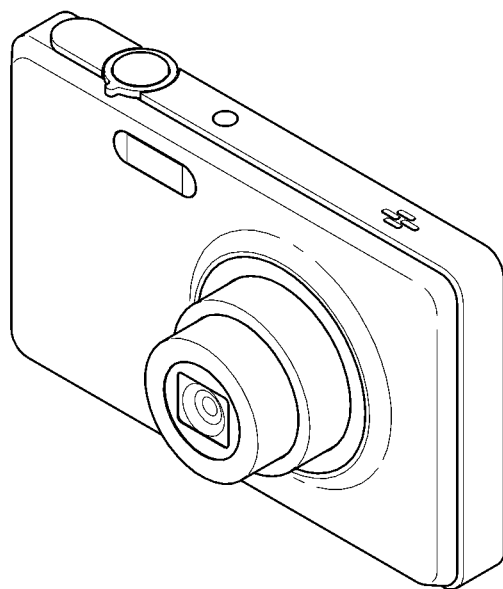

FIGS. 20 and 21 illustrate electronic devices implemented with image sensors according to embodiments of the inventive concepts.

The image sensor according to embodiments of the inventive concepts may be applied to various electronic devices with an image photographing function. For example, the image sensor according to the inventive concepts may be applied to a mobile or smart phone 2000 illustrated in FIG. 20, a digital camera 3000 illustrated in FIG. 21, and/or a camcorder.

In other embodiments, the image sensor according to embodiments of the inventive concepts may be applied to a personal digital assistant (PDA), a portable multimedia player (PMP), a digital multimedia broadcast (DMB) device, a global positioning system (GPS) device, a handled gaming console, a portable computer, a web tablet, a wireless phone, a digital music player, a memory card, or other electronic products. The other electronic products may receive or transmit information data by wireless.

According to embodiments of the inventive concepts, the length of the source follower gate may be greater than the lengths of the reset and selection gates in the limited pixel region. In other words, since the area of the source follower gate increases in the limited pixel region, it is possible to reduce or minimize the noise which may be caused by the charges randomly trapped or de-trapped to or from the gate insulating layer by the current fluctuation of the channel of the source follower gate.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An image sensor comprising:
   a substrate having a first surface and a second surface facing each other;
   a first photoelectric conversion element in the substrate;
   a second photoelectric conversion element in the substrate;
   a first gate having a first length in a first direction;
   a second gate having a second length in the first direction;
   a common floating diffusion region;
   a third gate having a third length in the first direction greater than the first length;
   a first contact disposed directly adjacent to the first gate;
   a second contact disposed directly adjacent to the second gate;
   a first transfer gate configured to transfer a first charge accumulated in the first photoelectric conversion element to the common floating diffusion region; and
   a second transfer gate configured to transfer a second charge accumulated in the second photoelectric conversion element to the common floating diffusion region,
   wherein the second contact, the second gate, the first gate, and the first contact are sequentially arranged along the first direction,
   wherein the second gate, the first transfer gate, and the second transfer gate are arranged along a second direction perpendicular to the first direction, and
   wherein the first, second, and third gates are connected both to the first and second photoelectric conversion elements.

2. The image sensor of claim 1, further comprising a first micro-lens on the first photoelectric conversion element and a second micro-lens on the second photoelectric conversion element.

3. The image sensor of claim 2, wherein the first gate, the first transfer gate, the second transfer gate, and the third gate are arranged along the second direction.

4. The image sensor of claim 3, further comprising:
   a first isolation between the first photoelectric conversion element and the second photoelectric conversion element; and
   an air gap formed in the first isolation.

5. The image sensor of claim 4, further comprising:
   a second isolation in the substrate formed from the first surface, and
   wherein the first micro-lens is disposed on the second surface.

6. The image sensor of claim 4, further comprising:
   a third contact right adjacent to the third gate; and
   a fourth contact right adjacent to the third gate,
   wherein the fourth contact, the third gate, and the third contact are sequentially arranged along the first direction.

7. The image sensor of claim 6, wherein the second contact and the fourth contact are aligned in the second direction.

8. The image sensor of claim 6, wherein the first length is different from the second length.

9. The image sensor of claim 8, wherein the third length is different from the second length.

10. The image sensor of claim 9, wherein the second contact and the fourth contact are aligned in the second direction.

11. An image sensor comprising:
    a substrate having a first surface and a second surface facing each other;
    a first photoelectric conversion element in the substrate;
    a second photoelectric conversion element in the substrate;
    a first gate having a first length in a first direction;
    a second gate having a second length in the first direction;
    a first floating diffusion contact;
    a second floating diffusion contact;
    a third gate having a third length in the first direction greater than the second length;
    a first contact disposed directly adjacent to the first gate;
    a second contact disposed directly adjacent to the second gate;
    a third contact disposed directly adjacent to the third gate;
    a fourth contact disposed on the third gate;
    a first transfer gate; and
    a second transfer gate,
    wherein the second contact, the second gate, the first gate, and the first contact are sequentially arranged along the first direction,
    wherein the first contact, the first transfer gate, and the second transfer gate are sequentially arranged along a second direction perpendicular to the first direction, wherein the third contact is offset from the fourth contact along the first direction, and wherein the first, second, and third gates are connected to both the first and second photoelectric conversion elements.

12. The image sensor of claim 11, wherein the first gate, the first transfer gate, the second transfer gate, and the third gate are sequentially arranged along the second direction.

13. The image sensor of claim 12, further comprising a first micro-lens on the first photoelectric conversion element and a second micro-lens on the second photoelectric conversion element.

14. The image sensor of claim 13, further comprising:
a first isolation between the first photoelectric conversion element and the second photoelectric conversion element; and
an air gap formed in the first isolation.

15. The image sensor of claim 14, further comprising a second isolation in the substrate formed from the first surface, and
wherein the first micro-lens is disposed on the second surface.

16. The image sensor of claim 15, further comprising a fifth contact right adjacent to the third gate, and
wherein the second contact and the fifth contact are vertically aligned along the second direction.

17. The image sensor of claim 15, wherein the first length is different from the second length.

18. The image sensor of claim 15, wherein the third length is different from the second length.

19. An image sensor comprising:
a substrate having a first surface and a second surface facing each other;
a first photoelectric conversion element in the substrate;
a second photoelectric conversion element in the substrate;
a selection gate having a first length in a first direction;
a reset gate having a second length in the first direction;
a common floating diffusion region;
a floating diffusion contact connected to the common floating diffusion region;
a source follower gate having a third length in the first direction, the third length is being greater than the first length;
a first contact disposed right adjacent to the selection gate;
a second contact disposed right adjacent to the reset gate;
a first transfer gate configured to transfer a first charge accumulated in the first photoelectric conversion element to the common floating diffusion region; and
a second transfer gate configured to transfer a second charge accumulated in the second photoelectric conversion element to the common floating diffusion region,
wherein the selection gate, the first contact, the reset gate, and the second contact are arranged in the first direction,
wherein the reset gate, the first transfer gate, the common floating diffusion, and the second transfer gate are sequentially arranged in a second direction perpendicular to the first direction, and
wherein the selection gate, the reset gate, and the source follower gate are connected both to the first and second photoelectric conversion elements.

20. The image sensor of claim 19, further comprising:
a first isolation between the first photoelectric conversion element and the second photoelectric conversion element;
an air gap formed in the first isolation,
a second isolation in the substrate formed from the first surface,
wherein the first micro-lens is disposed on the second surface, and
wherein the floating diffusion contact and the second contact are vertically arranged in the second direction.

* * * * *